US012628416B2

(12) United States Patent
Yen et al.

(10) Patent No.: US 12,628,416 B2
(45) Date of Patent: May 12, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Hung-Yu Yen, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 394 days.

(21) Appl. No.: 18/136,485

(22) Filed: Apr. 19, 2023

(65) Prior Publication Data

US 2024/0355825 A1 Oct. 24, 2024

(51) Int. Cl.
| | |
|---|---|
| *H10D 84/85* | (2025.01) |
| *H10D 30/01* | (2025.01) |
| *H10D 30/62* | (2025.01) |
| *H10D 84/01* | (2025.01) |
| *H10D 84/03* | (2025.01) |

(52) U.S. Cl.
CPC ......... *H10D 84/853* (2025.01); *H10D 30/024* (2025.01); *H10D 30/6211* (2025.01); *H10D 84/0193* (2025.01); *H10D 84/038* (2025.01)

(58) Field of Classification Search
CPC .. H10D 30/014; H10D 30/43; H10D 30/6735; H10D 62/116; H10D 62/121
See application file for complete search history.

(56) References Cited

U.S. PATENT DOCUMENTS

| | | | | |
|---|---|---|---|---|
| 11,362,091 | B2 * | 6/2022 | Fulford | .................. H10D 84/83 |
| 2007/0148903 | A1 * | 6/2007 | Kim | .................. H01L 21/02164 |
| | | | | 257/E21.546 |
| 2024/0030284 | A1 * | 1/2024 | Kang | .................... H10D 64/021 |

* cited by examiner

*Primary Examiner* — Tuan A Hoang
(74) *Attorney, Agent, or Firm* — Birch, Stewart, Kolasch & Birch, LLP

(57) ABSTRACT

A semiconductor device includes a substrate, a plurality of active structures, a trench, a lower epitaxy, an upper epitaxy and a bottom barrier portion. The active structures are formed on the substrate and arranged in a first direction. The trench passes through adjacent two of the active structures in a second direction and has a bottom recess. The lower epitaxy is formed on a lower portion of the trench. The upper epitaxy is formed on an upper portion of the trench and separated from the lower epitaxy. The bottom barrier portion is formed on the bottom recess and separates the substrate and the lower epitaxy.

20 Claims, 22 Drawing Sheets

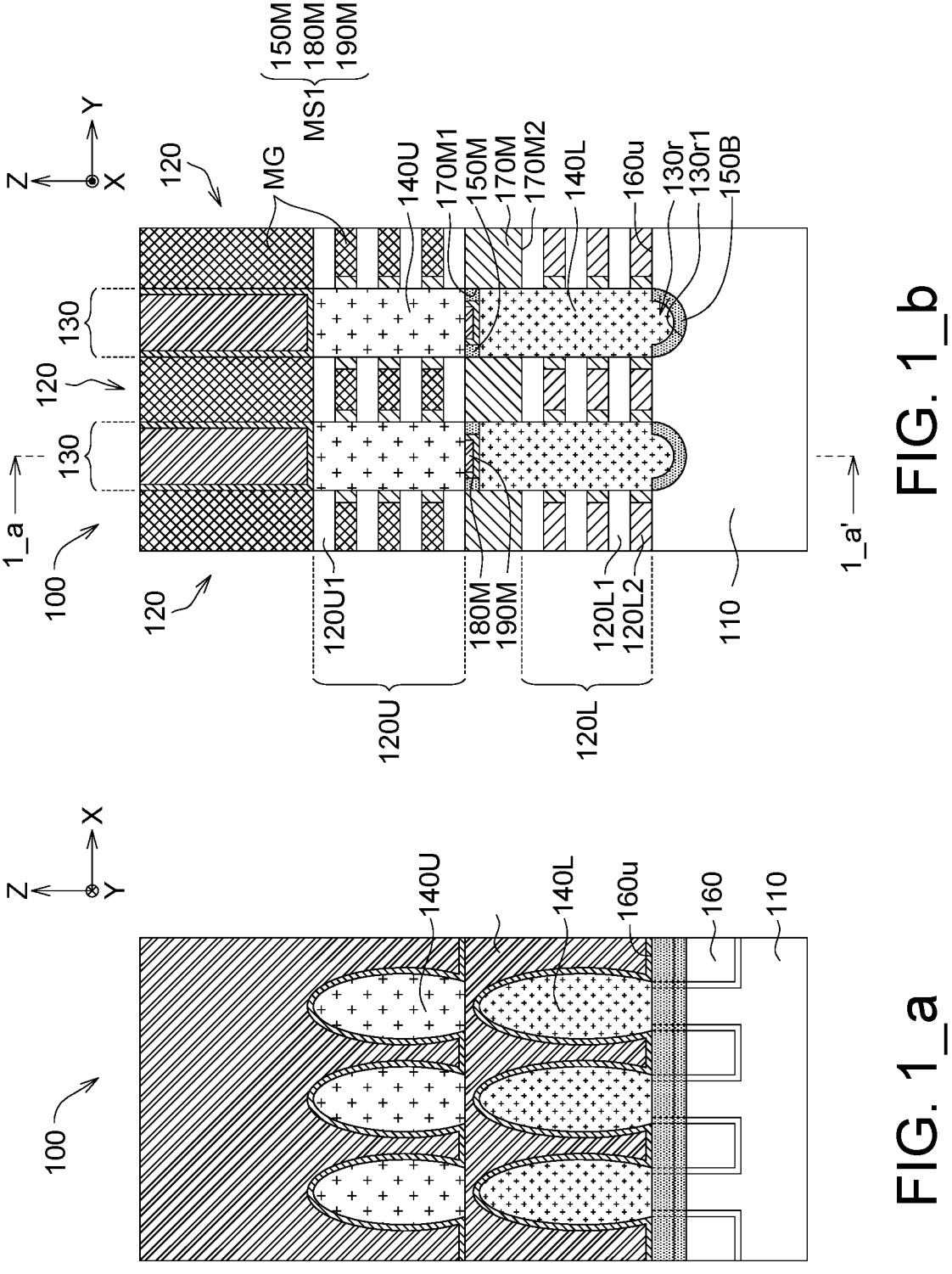
FIG. 1_b
FIG. 1_a

120U1'
120U2'

120M'

120L1'
120L2'

110

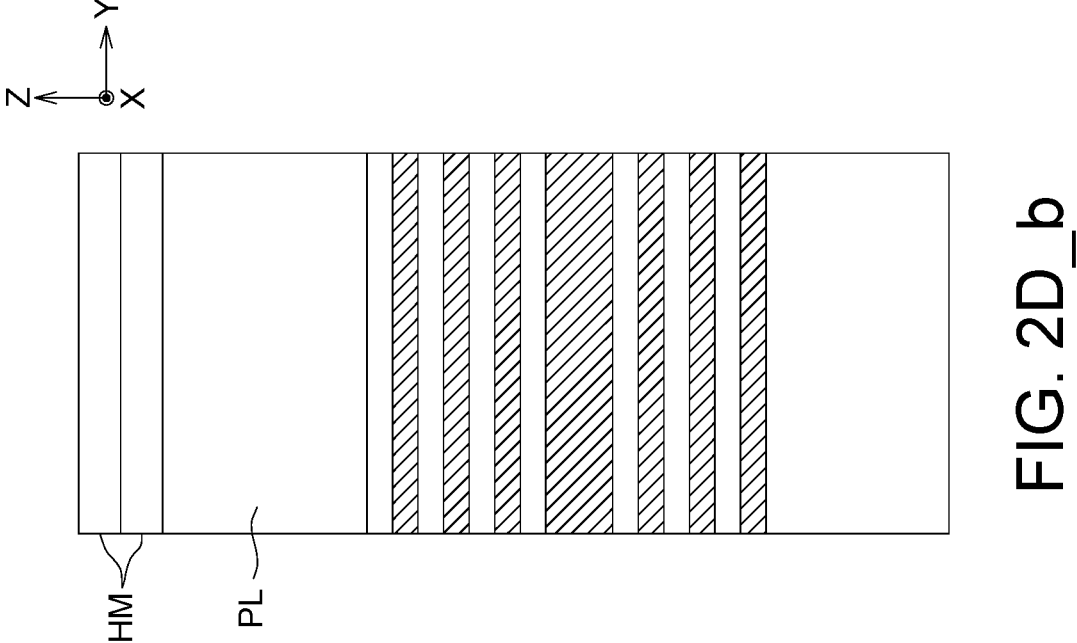
FIG. 2D_b
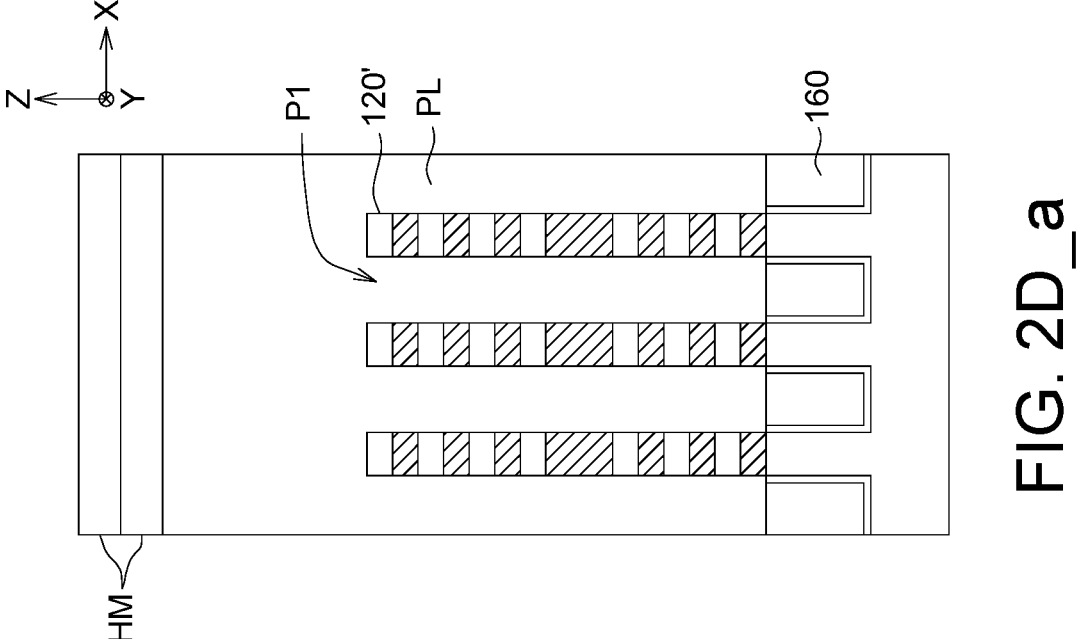
FIG. 2D_a

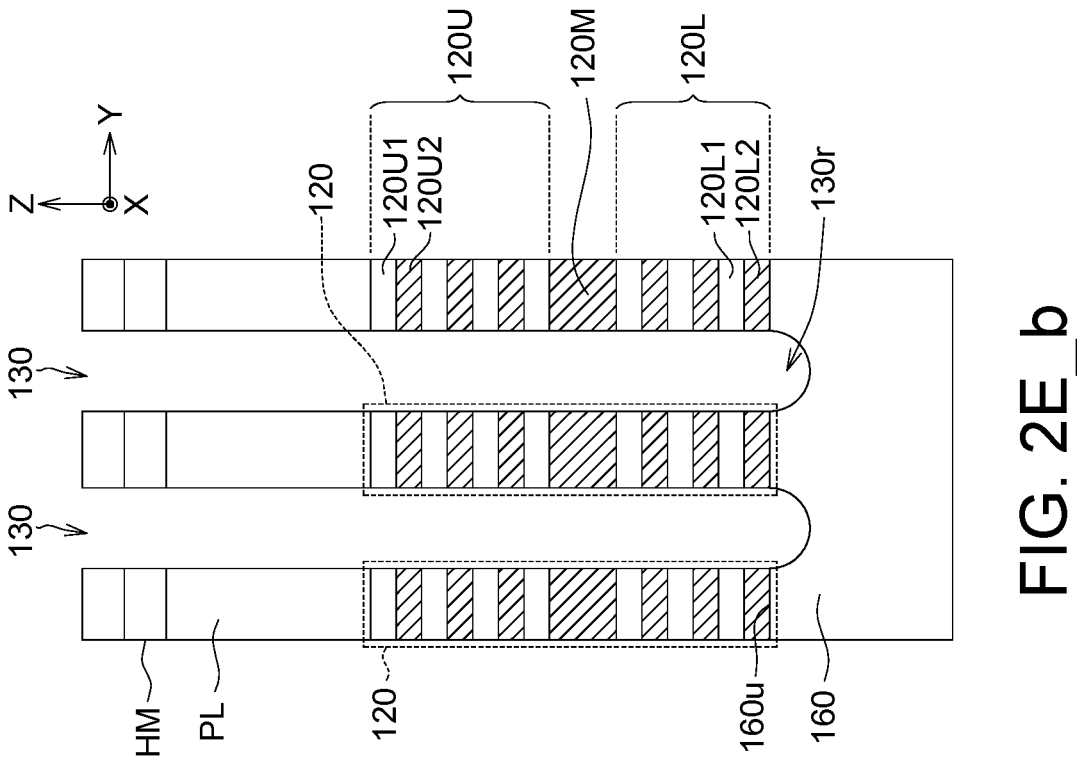
FIG. 2E_b
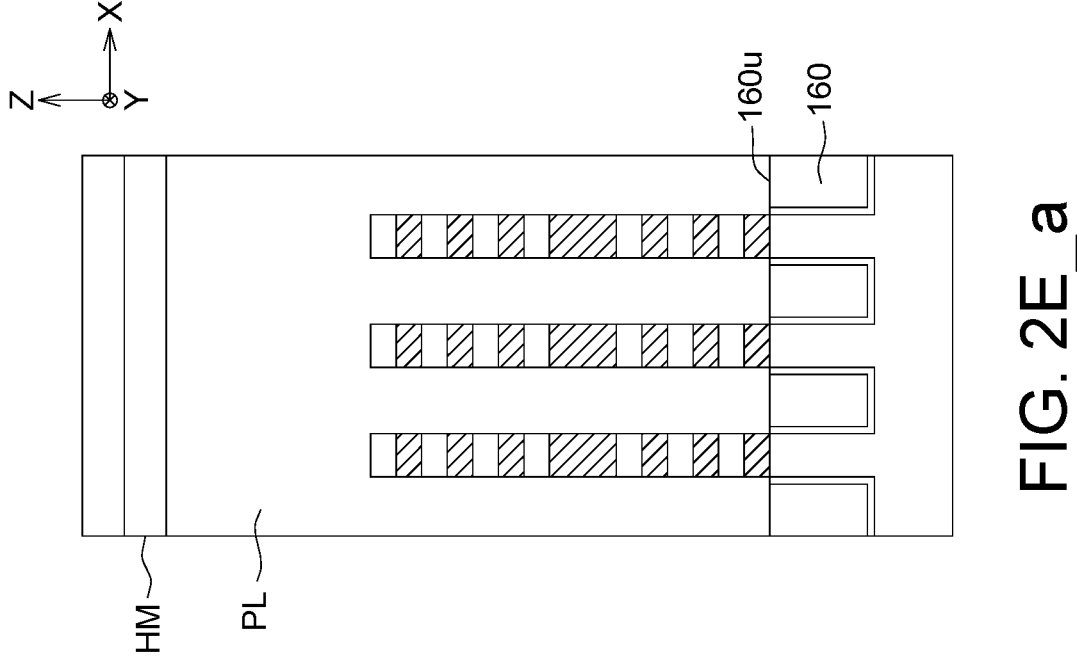
FIG. 2E_a

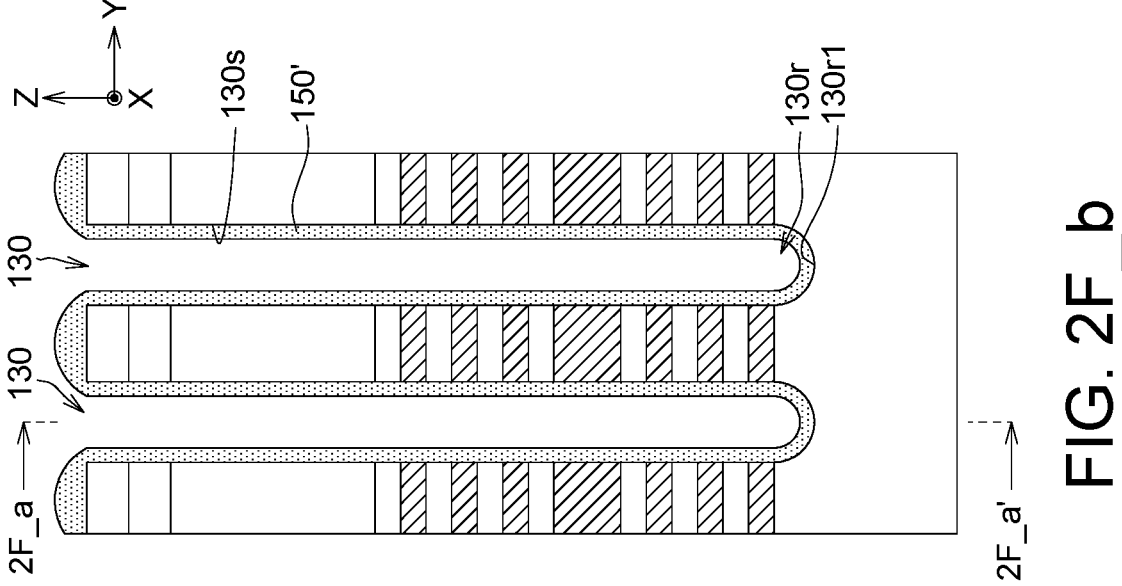
FIG. 2F_b
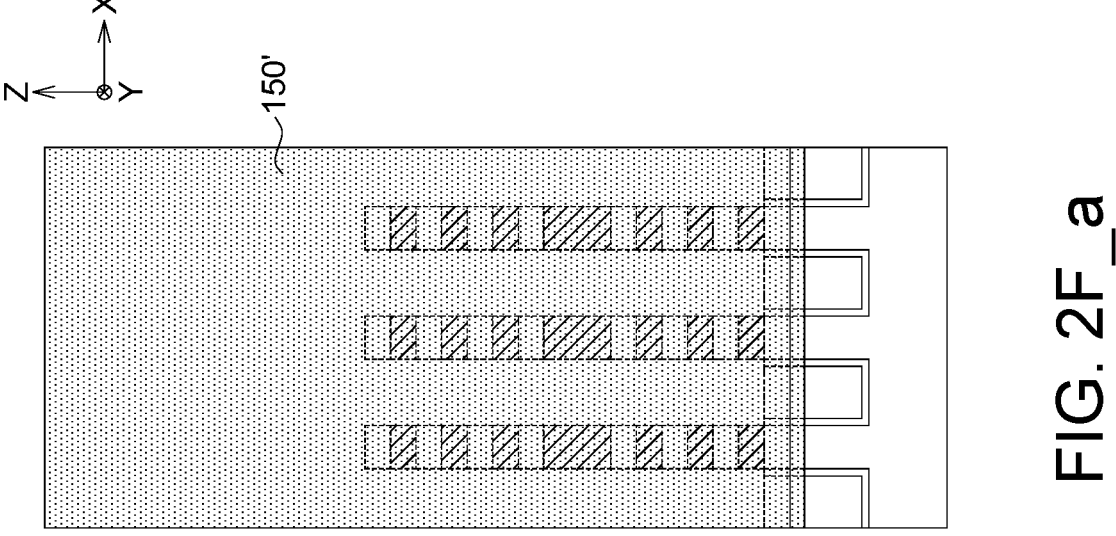
FIG. 2F_a

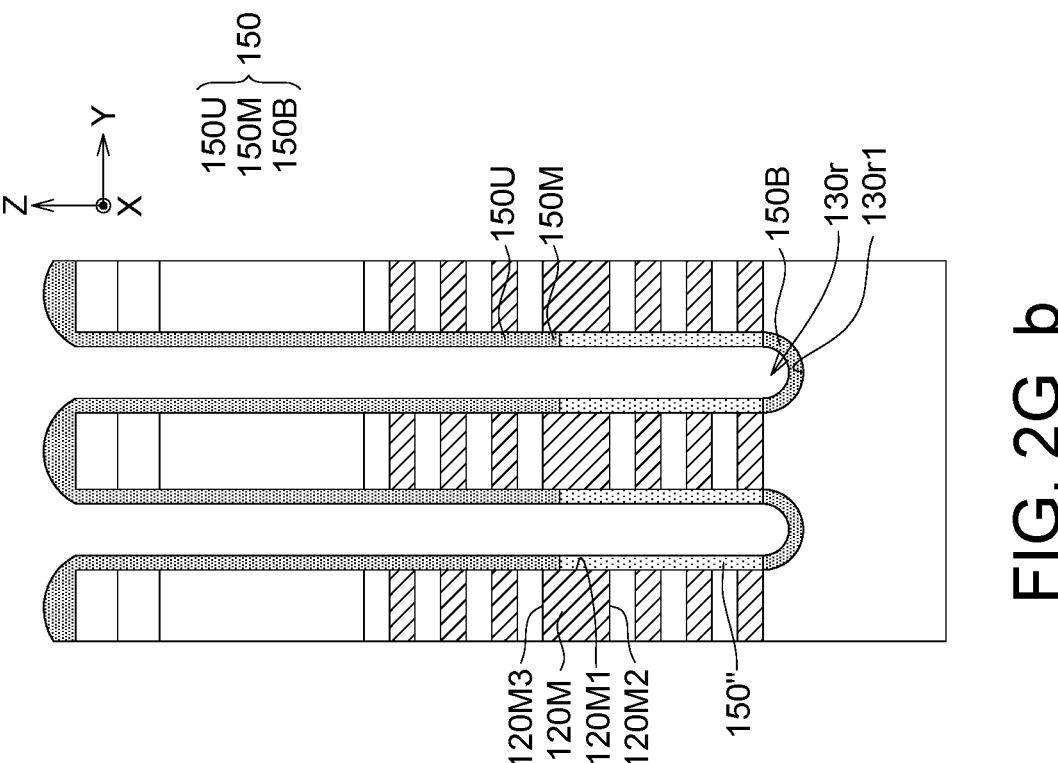
FIG. 2G_b
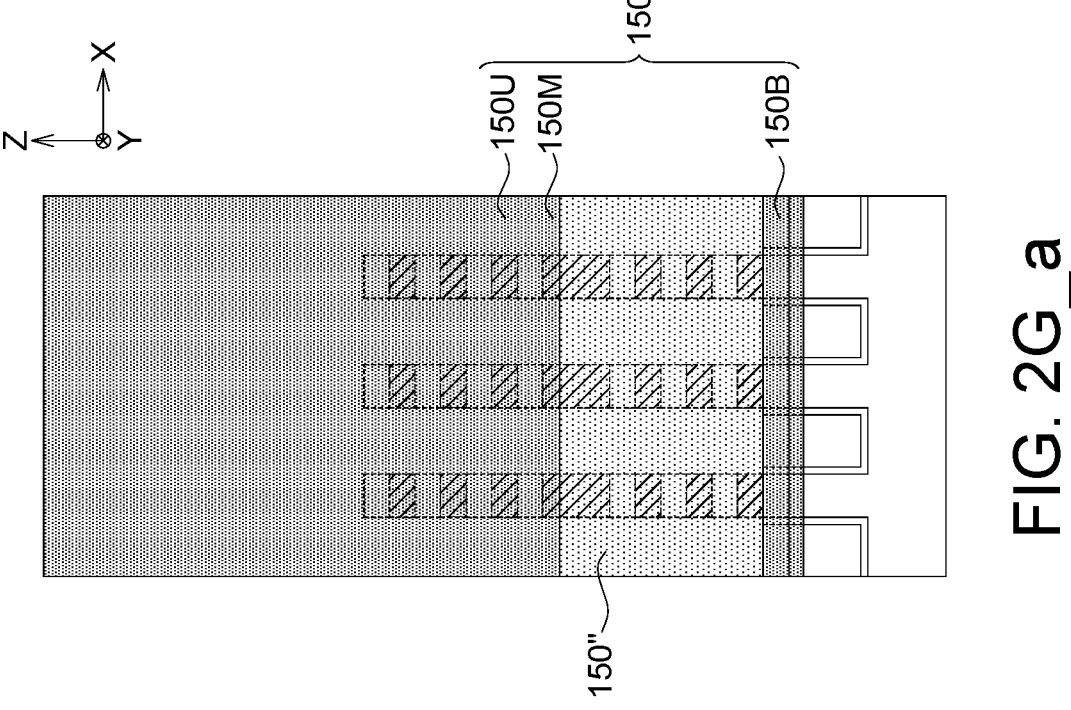
FIG. 2G_a

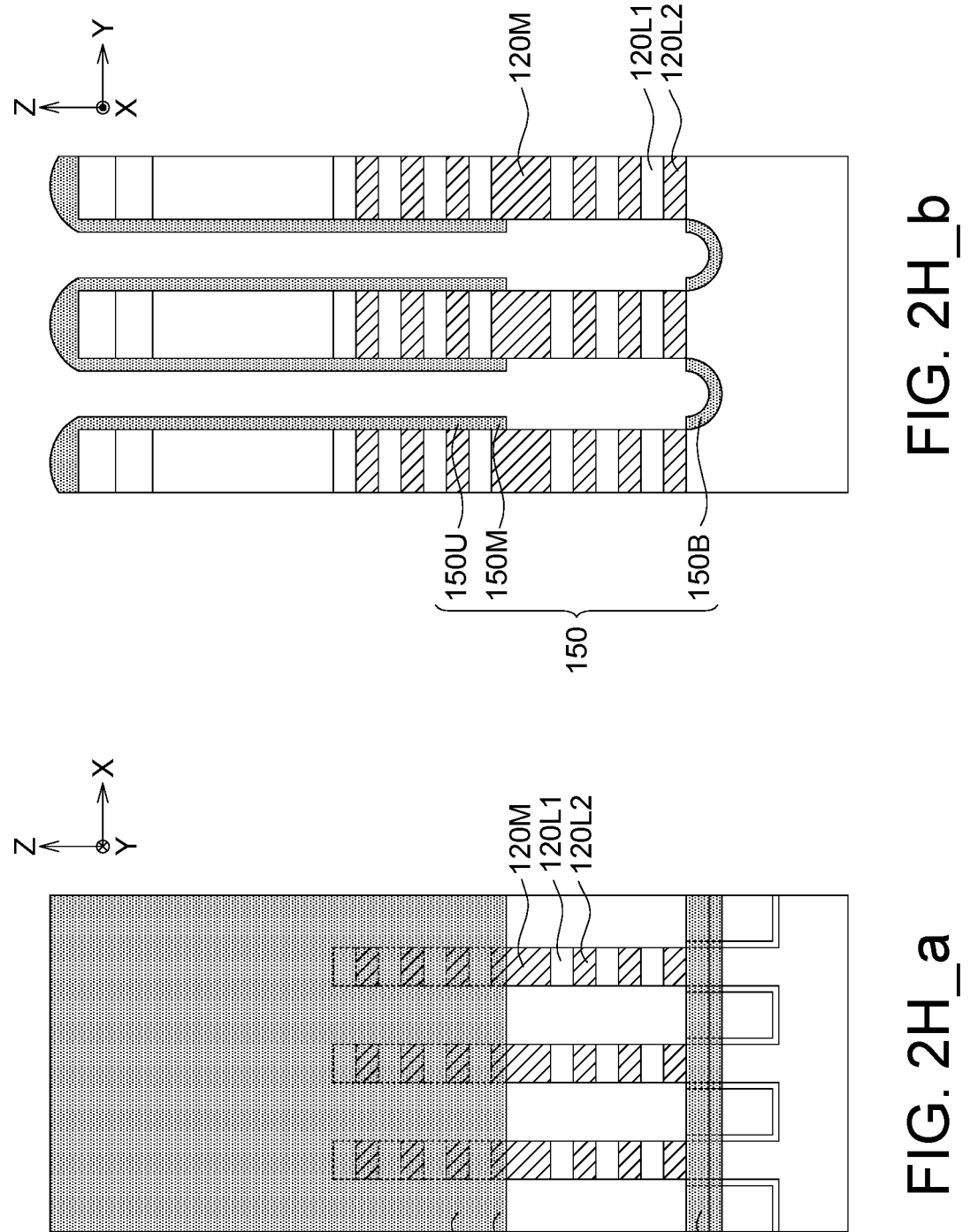
FIG. 2H_b
FIG. 2H_a

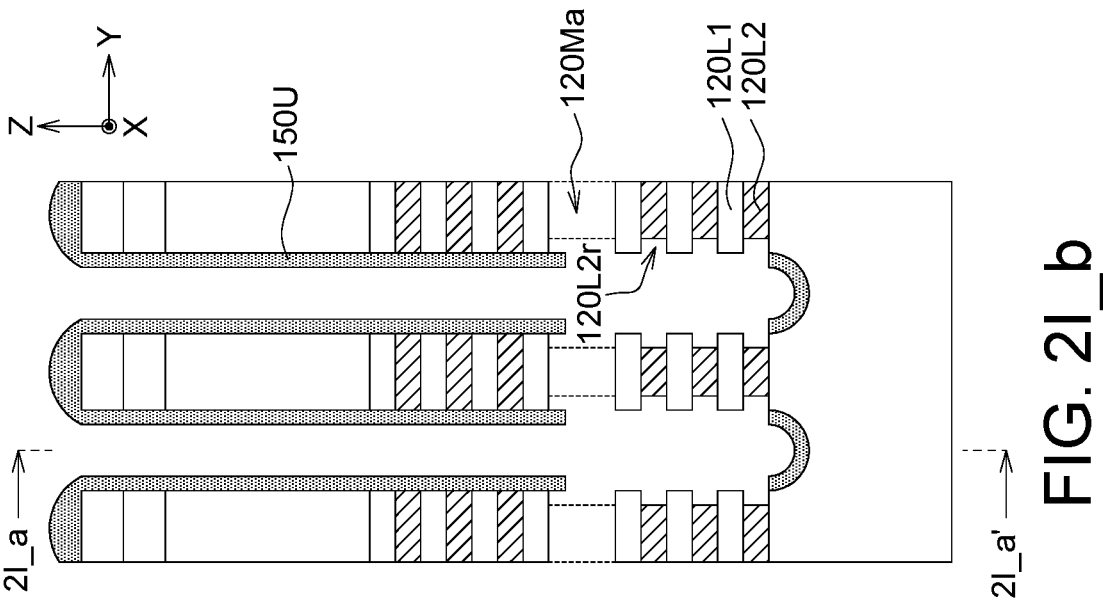
FIG. 2I_b
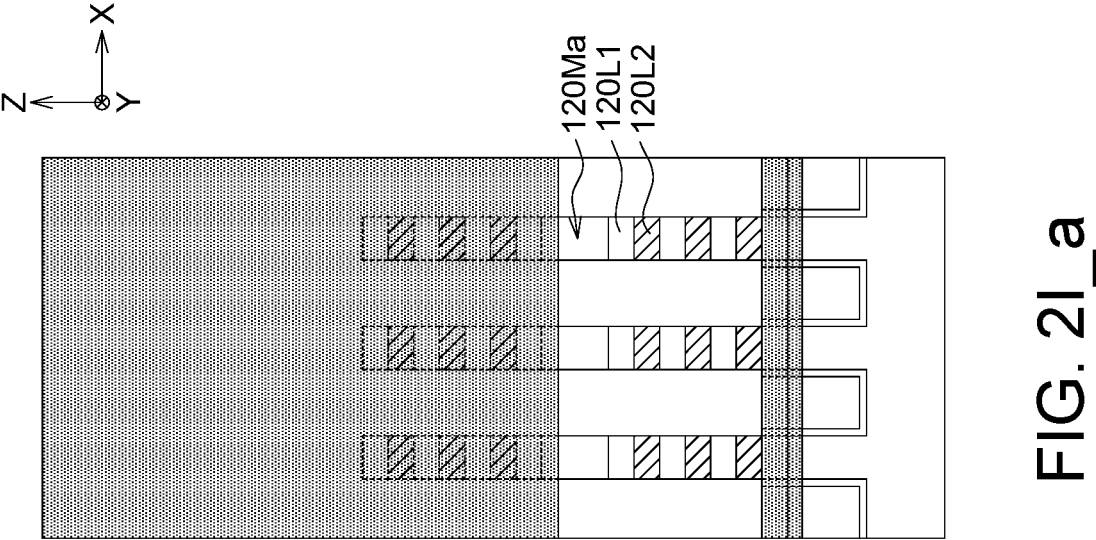
FIG. 2I_a

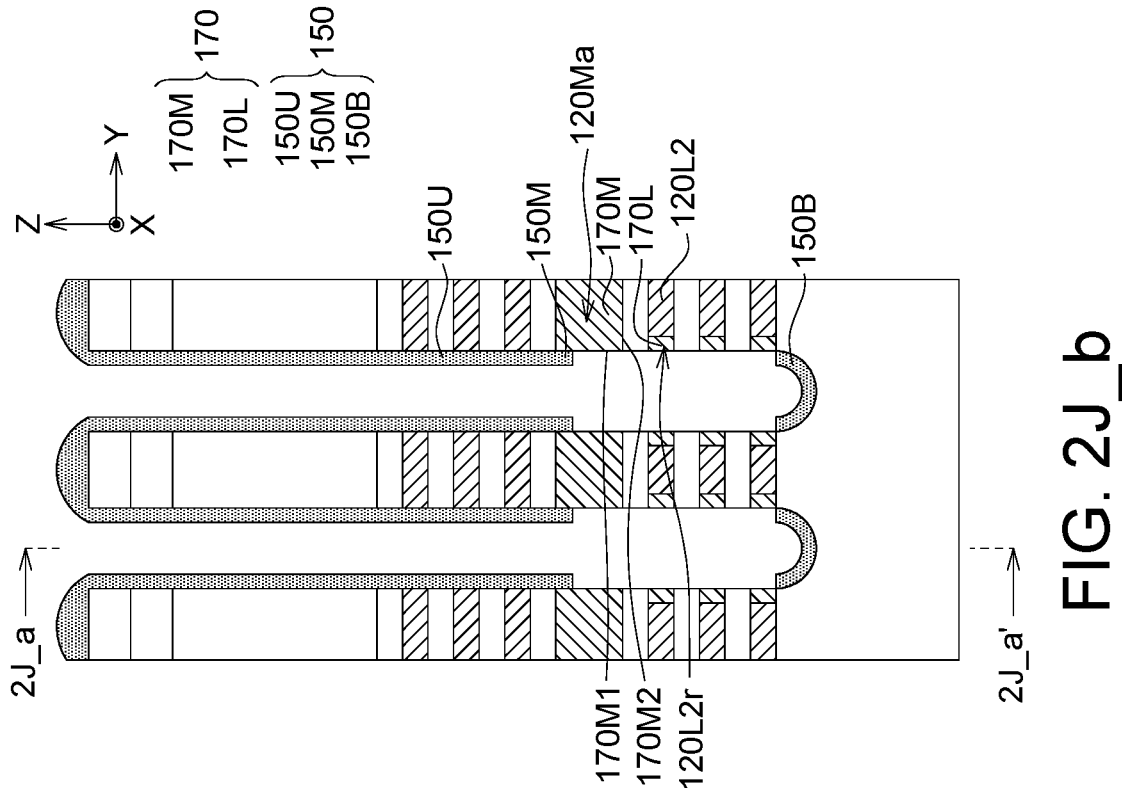
FIG. 2J_b
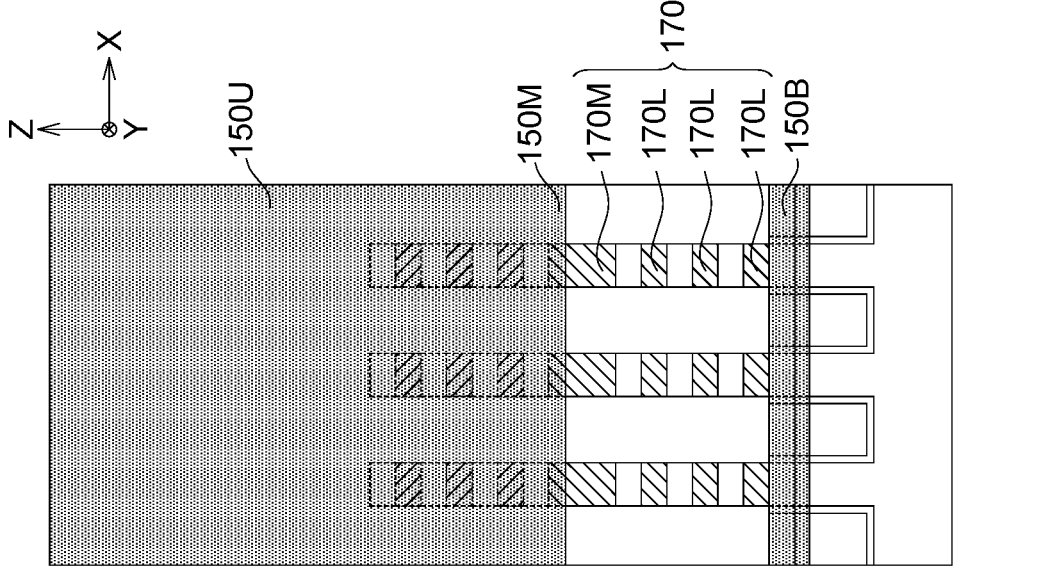
FIG. 2J_a

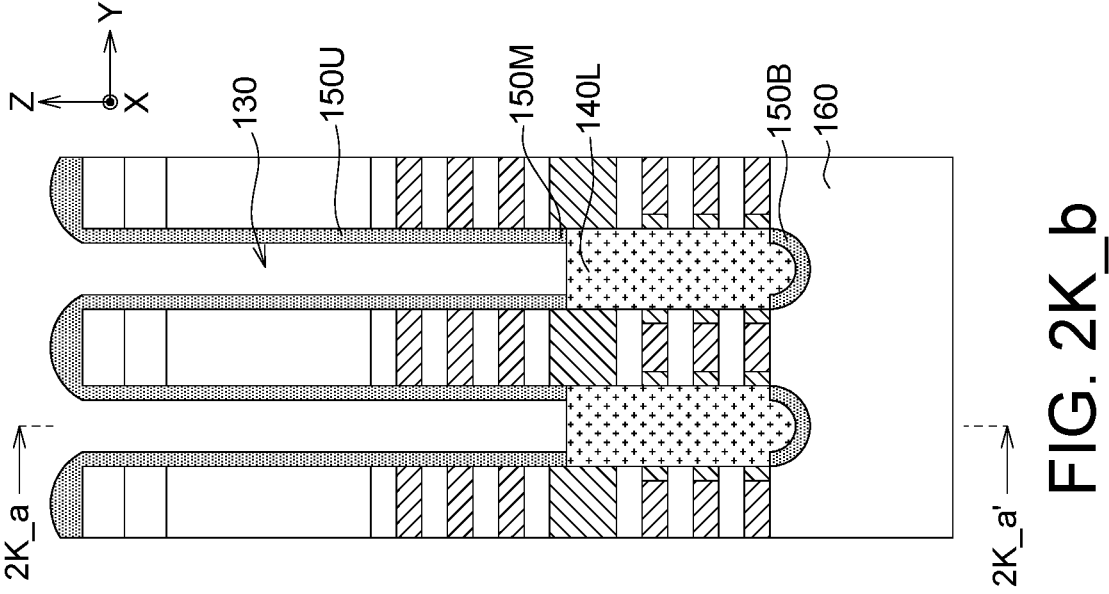
FIG. 2K_b
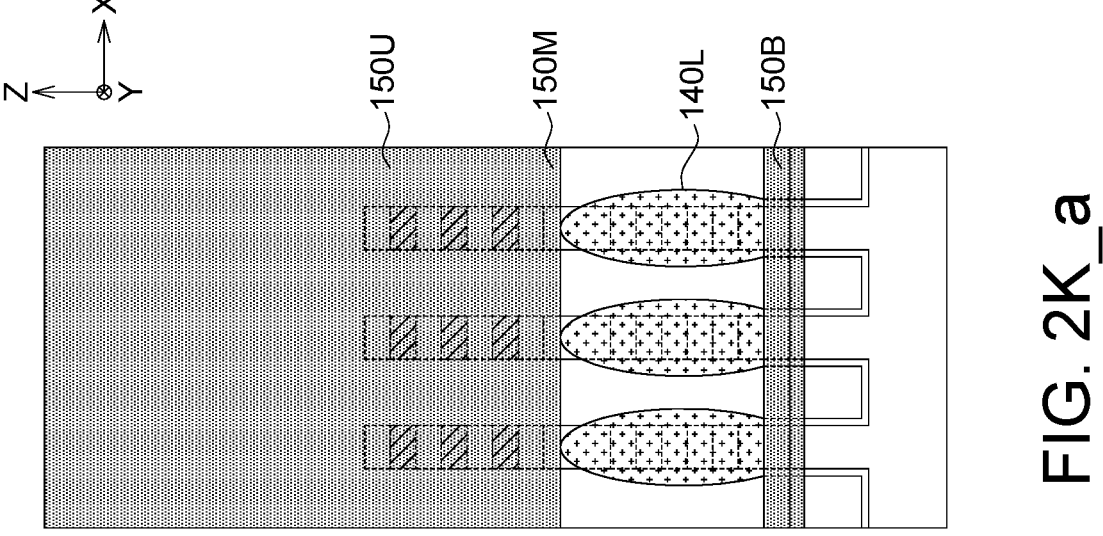
FIG. 2K_a

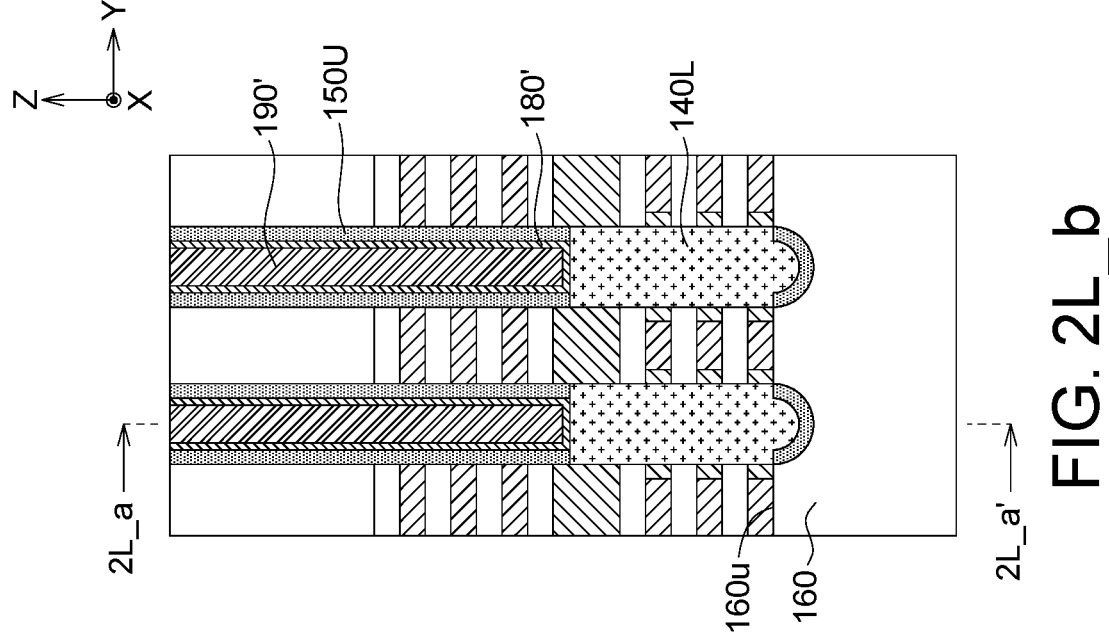
FIG. 2L_b
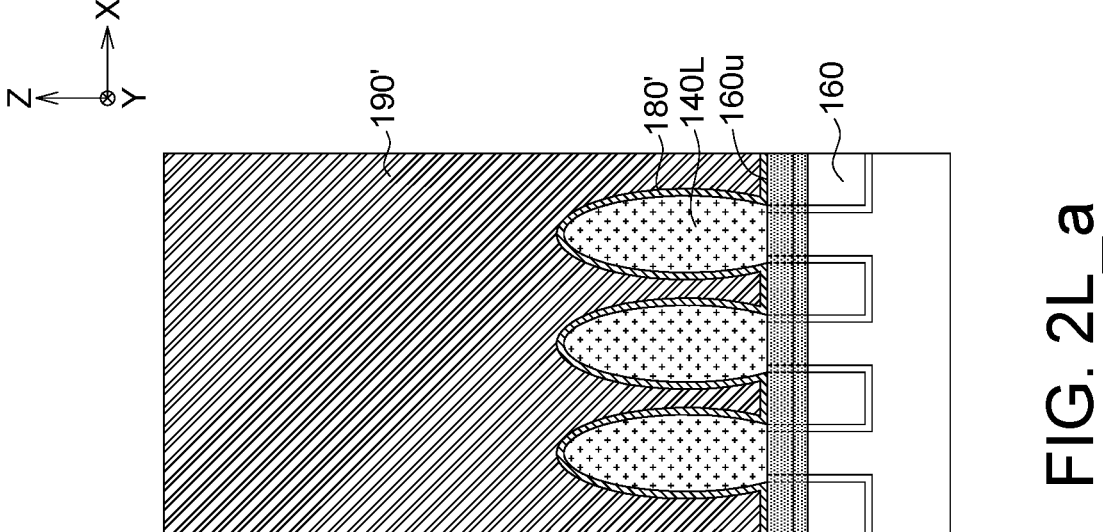
FIG. 2L_a

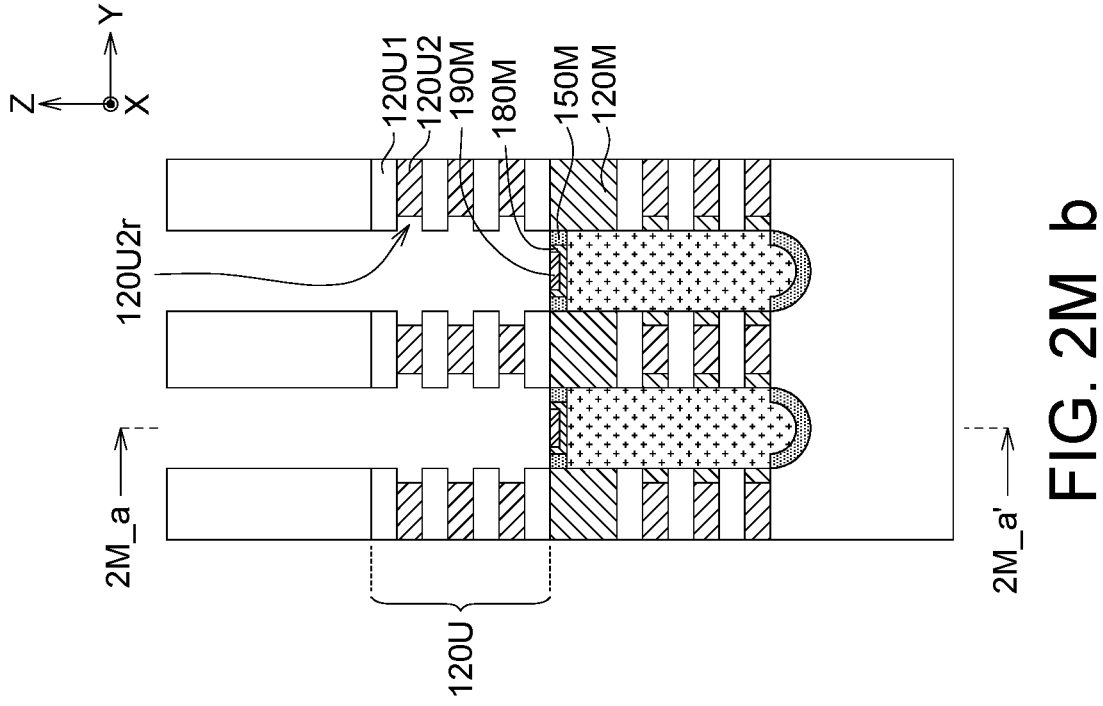
FIG. 2M_b
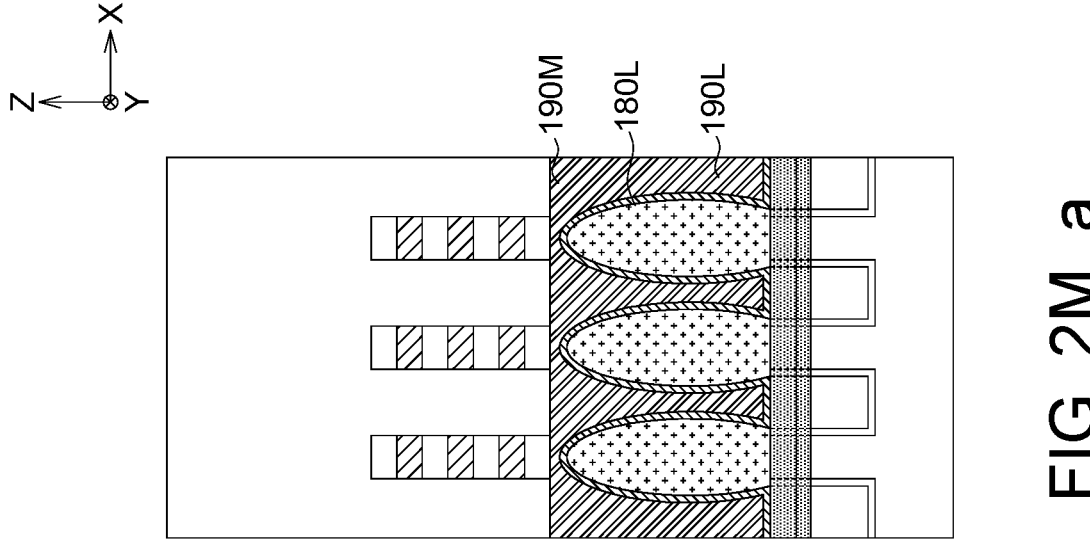
FIG. 2M_a

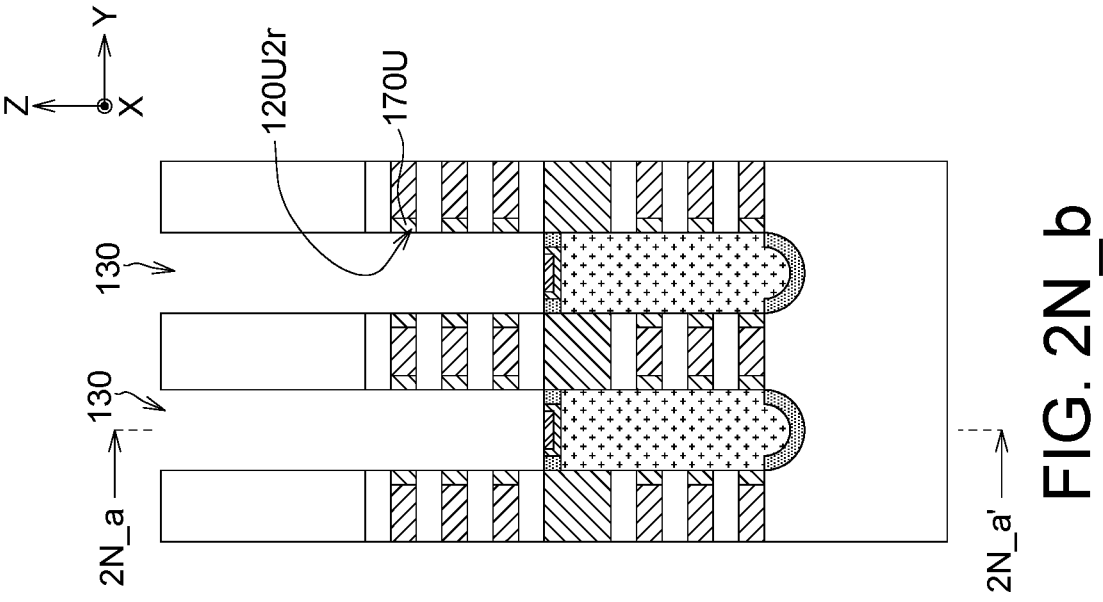
FIG. 2N_b
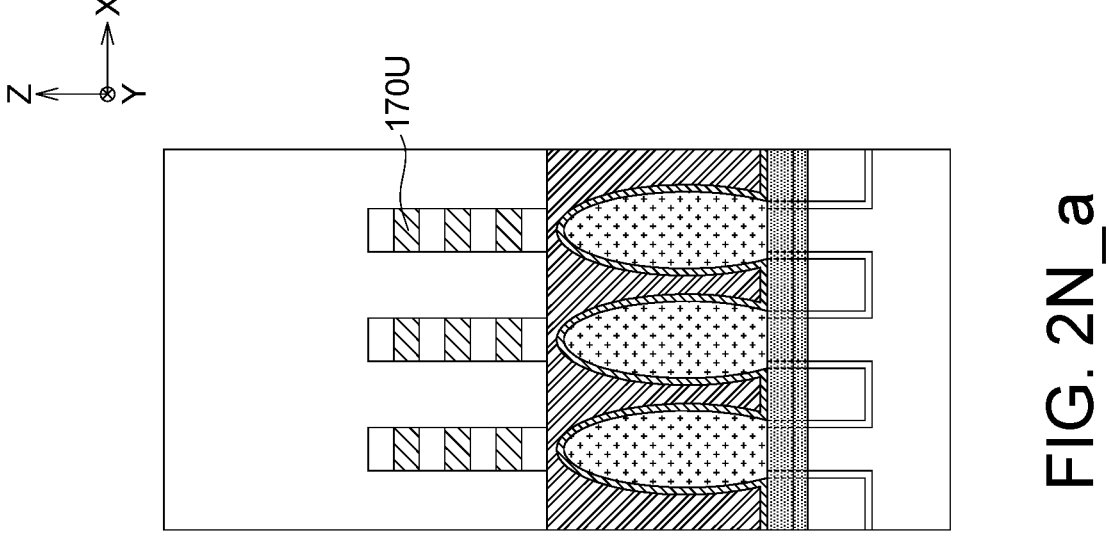
FIG. 2N_a

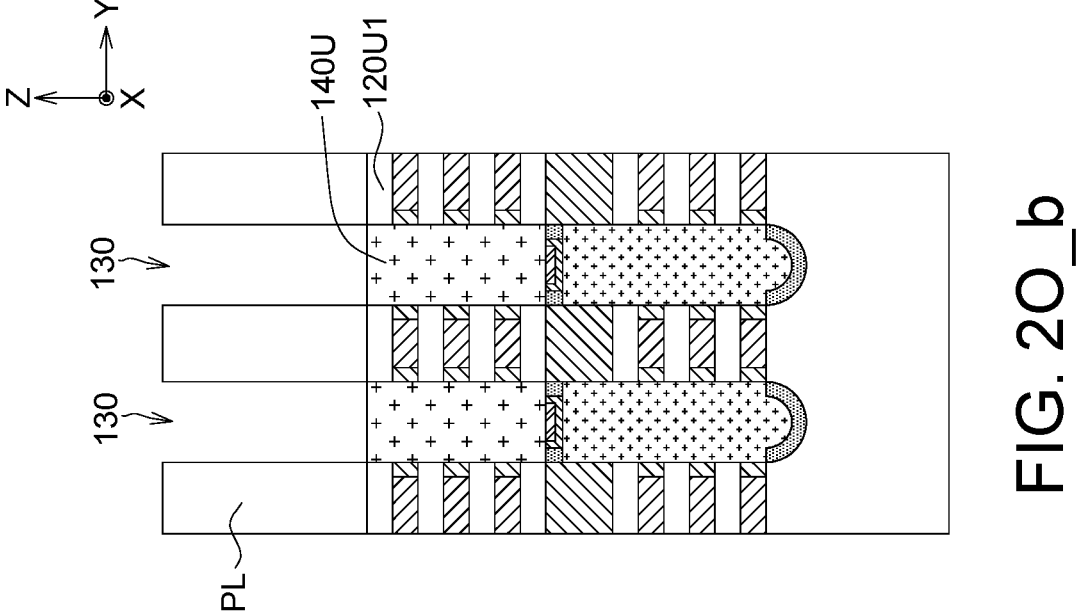
FIG. 20_b
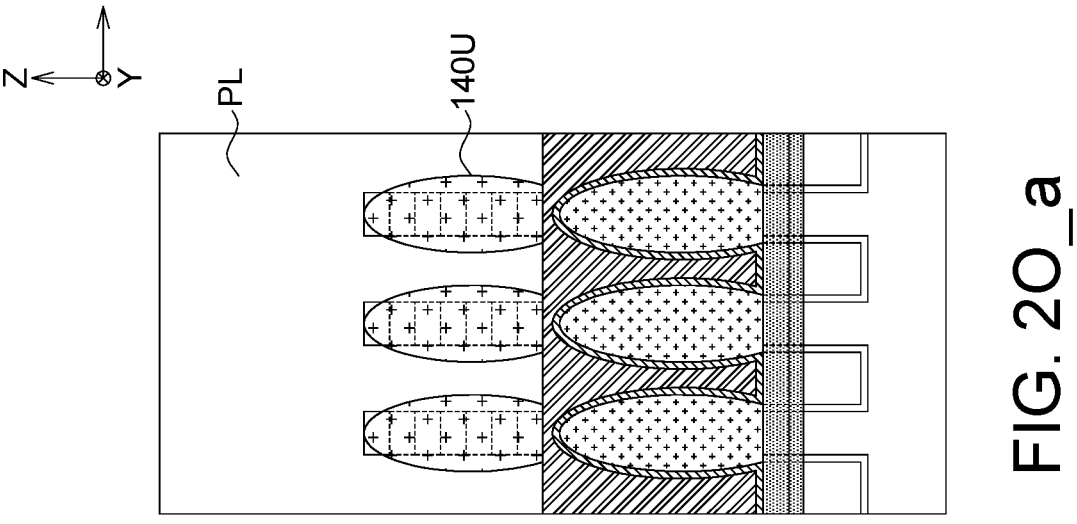
FIG. 20_a

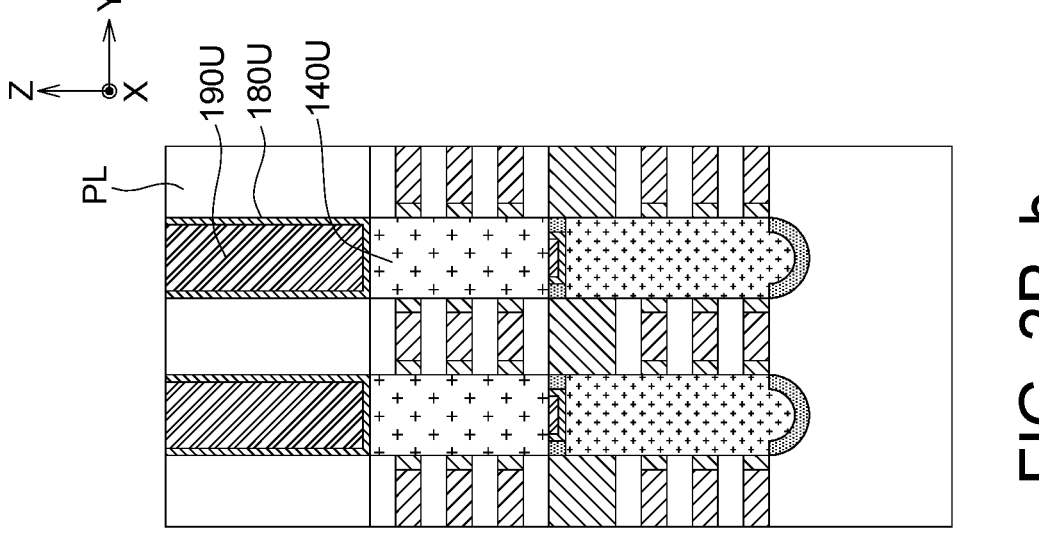
FIG. 2P_b
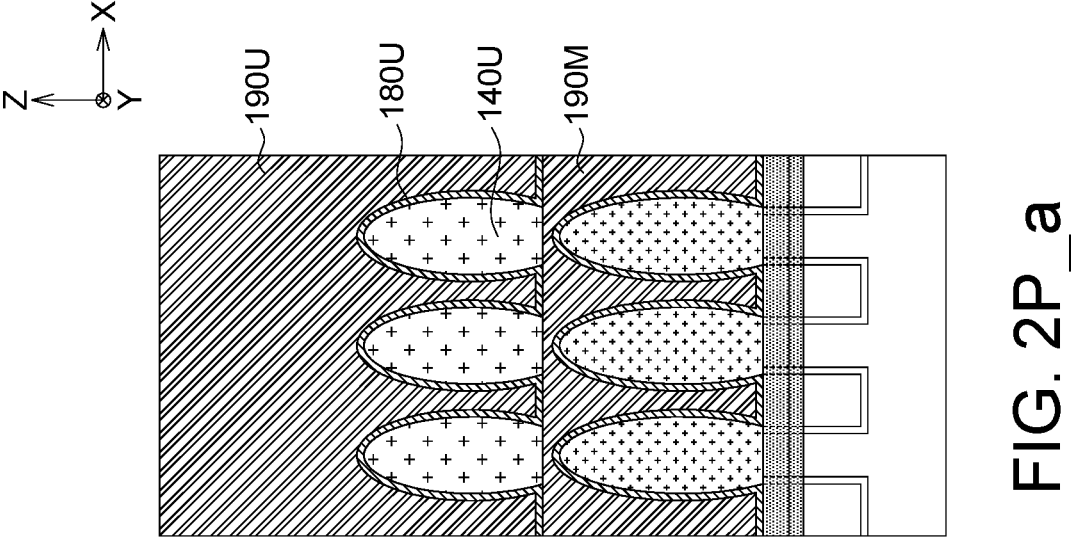
FIG. 2P_a

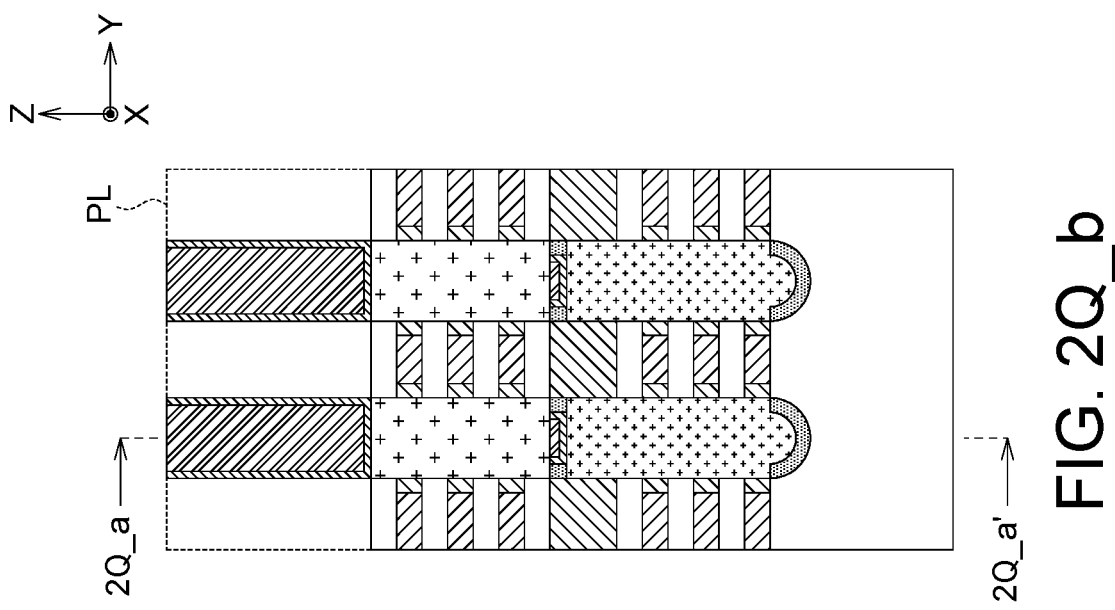
FIG. 2Q_b
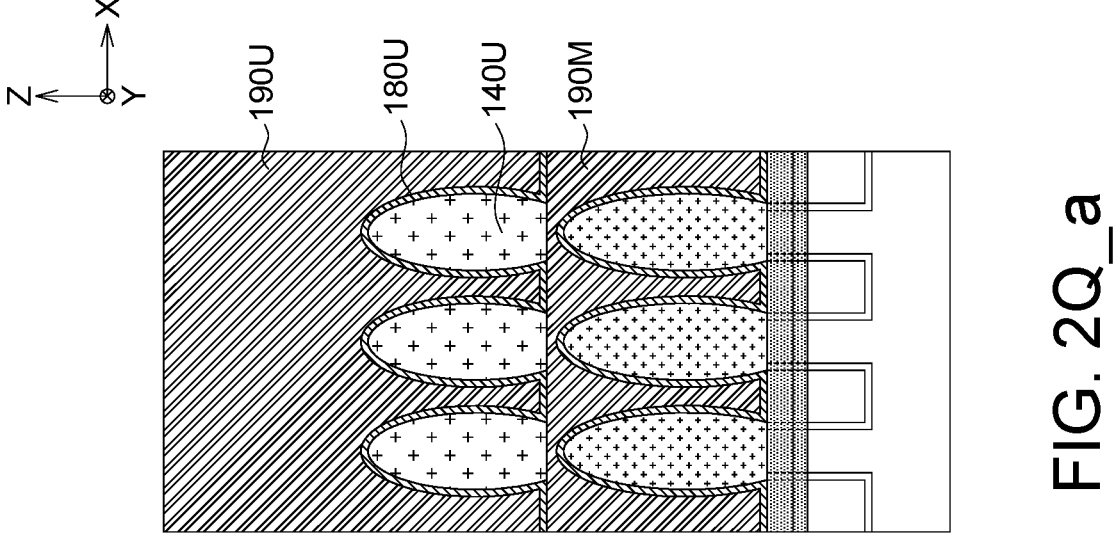
FIG. 2Q_a

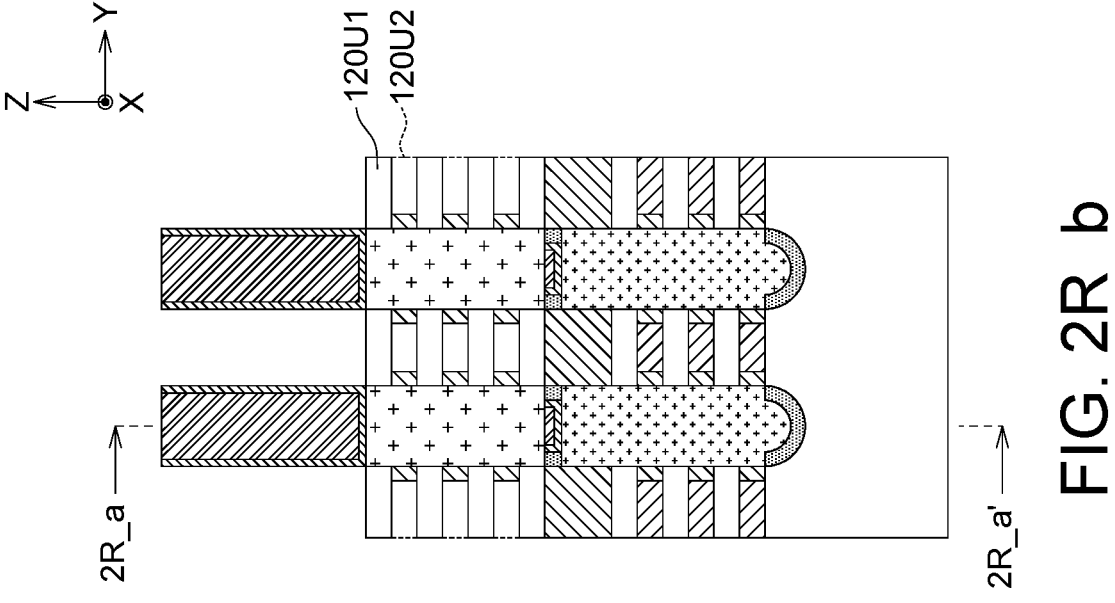
FIG. 2R_b
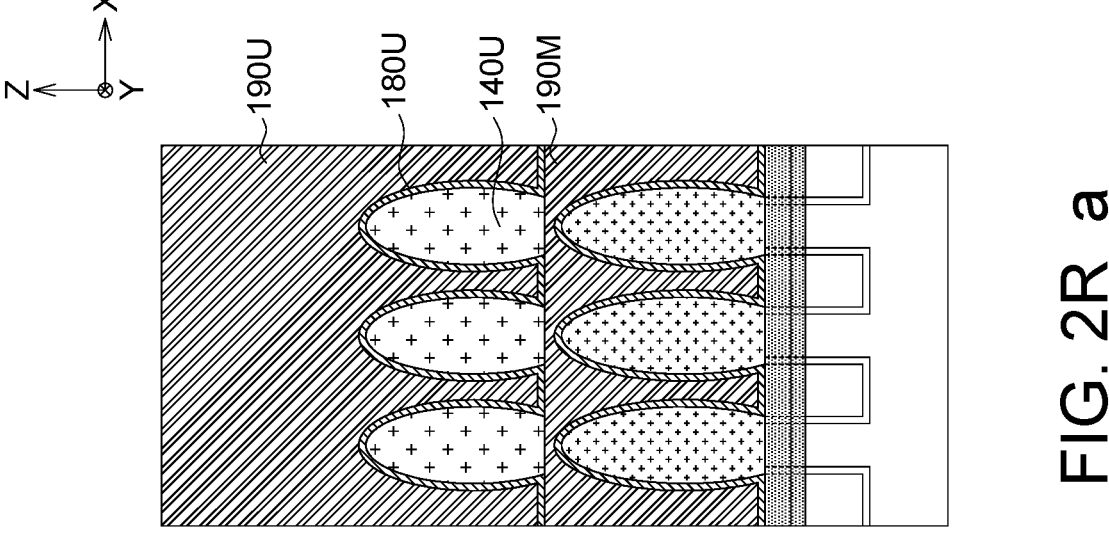
FIG. 2R_a

SEMICONDUCTOR DEVICE AND MANUFACTURING METHOD THEREOF

BACKGROUND

For device scaling, to narrow a distance between NMOS and PMOS is the key. NMOS and PMOS are vertically stacked is one of approach to make it. However, the integration flow is challenging. Especially, to pattern the NMOS/PMOS epitaxy in the vertical direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1_a illustrates a schematic diagram of a cross-sectional view of a semiconductor device 100 in a first direction;

FIG. 1_b illustrates a schematic diagram of a cross-sectional view of a semiconductor device 100 in a second direction;

FIGS. 2A to 2R_b illustrate schematic diagrams of manufacturing processes of the semiconductor device 100 of FIGS. 1_a and 1_b;

FIG. 2D_b illustrates a cross-sectional view of the semiconductor structure of FIG. 2D along a direction 2D_b-2D_b';

FIG. 2E_b illustrates a cross-sectional view of the semiconductor structure of FIG. 2E along a direction 2E_b-2E_b';

FIG. 2F_b illustrates a cross-sectional view of the semiconductor structure of FIG. 2F along a direction 2F_b-2F_b';

FIG. 2G_a illustrates a schematic diagram of densifying the barrier layer material of FIG. 2F_a;

FIG. 2G_b illustrates a schematic diagram of densifying the barrier layer material of FIG. 2F_b;

FIG. 2H_a illustrates a schematic diagram of removing the remained barrier portion of FIG. 2G_a;

FIG. 2H_b illustrates a schematic diagram of removing the remained barrier portion of FIG. 2G_b;

FIG. 2I_a illustrates a schematic diagram of removing the middle spacer of FIG. 2H_a;

FIG. 2I_b illustrates a schematic diagram of removing the middle spacer of FIG. 2H_b;

FIG. 2J_a illustrates a schematic diagram of forming a middle inner spacer within the hollow portion and a lower inner spacer within the lower spacer recess of the lower spacer of FIG. 2I_a;

FIG. 2J_b illustrates a schematic diagram of forming the middle inner spacer within the hollow portion and the lower inner spacer within the lower spacer recess of the lower spacer of FIG. 2I_b;

FIG. 2K_a illustrates a schematic diagram of forming at least one lower epitaxy within the lower portion of the trench of FIG. 2J_a;

FIG. 2K_b illustrates a schematic diagram of forming at least one lower epitaxy within the lower portion of the trench of FIG. 2J_a;

FIG. 2L_a illustrates a schematic diagram of forming a contact etching stop layer (CESL) material on the lower epitaxy, the upper barrier portion and the oxide layer of FIG. 2K_a;

FIG. 2L_b illustrates a schematic diagram of forming the CESL material on the lower epitaxy, the upper barrier portion and the oxide layer of FIG. 2K_b;

FIG. 2M_a illustrates a schematic diagram of removing a portion of the ILD material of FIG. 2L_a;

FIG. 2M_b illustrates a schematic diagram of removing a portion of the ILD material of FIG. 2L_b;

FIG. 2N_a illustrates a schematic diagram of forming at least one upper inner spacer within the corresponding upper spacer recess of the upper spacers of FIG. 2M_a;

FIG. 2N_b illustrates a schematic diagram of forming at least one upper inner spacer within the corresponding upper spacer recess of the upper spacer layers of FIG. 2M_b;

FIG. 2O_a illustrates a schematic diagram of forming at least one upper epitaxy within the upper portion of the trench of FIG. 2N_a;

FIG. 2O_b illustrates a schematic diagram of forming at least one upper epitaxy within the upper portion of the trench of FIG. 2N_a;

FIG. 2P_a illustrates a schematic diagram of forming an upper CESL portion on the upper epitaxy, the middle ILD portion and the poly silicon material of FIG. 2O_a;

FIG. 2P_b illustrates a schematic diagram of forming the upper CESL portion on the upper epitaxy, the middle ILD portion and the poly silicon material of FIG. 2O_b;

FIG. 2Q_a illustrates a schematic diagram of removing the poly silicon material of FIG. 2P_a;

FIG. 2Q_b illustrates a schematic diagram of removing the poly silicon material of FIG. 2P_b;

FIG. 2R_a illustrates a schematic diagram of removing the upper spacer of FIG. 2Q_a; and FIG. 2R_b illustrates a schematic diagram of removing the upper spacer of FIG. 2R_b.

DETAILED DESCRIPTION

Figure 2A:
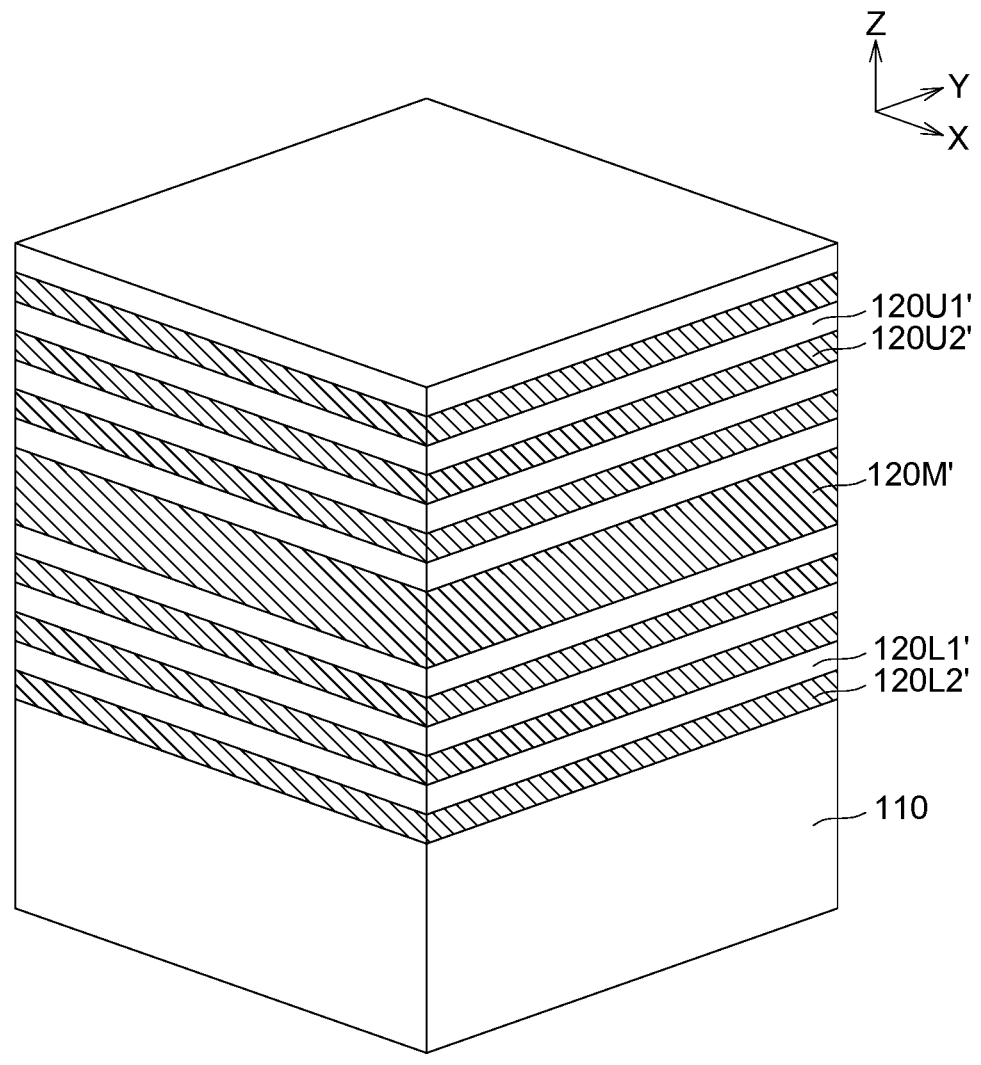

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIGS. 1_a and 1_b, FIG. 1_a illustrates a schematic diagram of a cross-sectional view of a semiconductor device 100 in a first direction, and FIG. 1_b illustrates a schematic diagram of a cross-sectional view of a semiconductor device 100 in a second direction. The semiconductor device 100 may be, for example, a CFET (Complementary FET).

As illustrated in FIGS. 1_a and 1_b, the semiconductor device 100 includes a substrate 110, a plurality of active structures 120, at least one trench 130, at least one lower (or bottom) epitaxy 140L, at least one upper (or top) epitaxy 140U and at least one bottom barrier portion 150B, an oxide layer 160 and a middle isolation MS1. The substrate 110 is, for example, a silicon wafer. The active structures 120, the trench 130, the lower epitaxy 140L, the upper epitaxy 140U and the bottom barrier portion, the oxide layer 160 and the middle isolation MS1 are formed on the substrate 110.

The active structures 120 are formed on the substrate 110 and arranged in a first direction (for example, Y axis). The trench 130 passes through adjacent two of the active structures 120 in a second direction (for example, X axis) and has a bottom recess 130r. The lower epitaxy 140L is formed on a lower portion of the trench 130, and the upper epitaxy 140U is formed on an upper portion of the trench 130 and separated from the lower epitaxy 140L. The bottom barrier portion 150B is formed on the bottom recess 130r and separates the substrate 110 from the lower epitaxy 140L for avoiding or reducing leakage current to the substrate 110.

As illustrated in FIGS. 1_a and 1_b, the active structure 120 includes an upper active region 120U and a lower active region 120L. The upper active region 120U and the lower active region 120L are stacked in a thickness direction (for example, Z axis). In an embodiment, the upper active region 120U is near a front side of the semiconductor device 100, and the lower active region 120L is near a back side of the semiconductor device 10. The lower active region 120L includes a plurality of the lower sheets 120L1 and the lower spacers 120L2, wherein one of the lower spacers 120L2 is formed between adjacent two of the lower sheets 120L1. The upper active region 120U includes a plurality of the upper sheets 120U1 and at least one portion of a metal gate MG, wherein a portion of the metal gate MG is formed between adjacent two of the upper sheets 120U1.

As illustrated in FIGS. 1_a and 1_b, the bottom recess 130r has a sidewall 130r1 on which the bottom barrier portion 150B is formed. The sidewall 130r1 has a curved surface, for example.

As illustrated in FIGS. 1_a and 1_b, the lower epitaxy 140L is one of source and drain, and the upper epitaxy 140U is another of source and drain. The lower epitaxy 140L and the upper epitaxy 140U may define, for example, a NMOS or a PMOS.

As illustrated in FIGS. 1_a and 1_b, the bottom barrier portion 150B is formed within the trench 130 and isolates the lower epitaxy 140L and the substrate 110. The bottom barrier portion 150B may cover the entire of the sidewall 130r1 of the bottom recess 130r. In an embodiment, the bottom barrier portion 150B is a shell or a thin film.

As illustrated in FIGS. 1_a and 1_b, the oxide layer 160 is formed on the substrate 110 and has an upper surface 160u. The aforementioned active structures 120 protrude with respect to the upper surface 160u of the oxide layer 160. The aforementioned bottom recess 130r is recessed with respect to the upper surface 160u of the oxide layer 160. In an embodiment, the oxide layer 160 is, for example, a STI (Shallow Trench Isolation).

As illustrated in FIGS. 1_a and 1_b, the middle inner spacer 170M is formed in the active structure 120 and has a lateral surface 170M1 and a lower surface 170M2. The middle inner spacer 170M may be formed between the upper active region 120U from the lower active region 120L and separates the upper active region 120U from the lower active region 120L.

As illustrated in FIGS. 1_a and 1_b, the middle isolation MS1 is located between the upper epitaxy 140U and the lower epitaxy 140L and isolates the upper epitaxy 140U from the lower epitaxy 140L. In an embodiment, the middle isolation MS1 is a multi-layered structure. For example, the middle isolation MS1 may include a middle barrier portion 150M, a middle CESL portion 180M and a middle ILD portion 190M.

Furthermore, the middle barrier portion 150M is formed on the lateral surface 170M1 of the middle inner spacer 170M and located between the lower epitaxy 140L and the upper epitaxy 140U for isolating the lower epitaxy 140L from the upper epitaxy 140U. The middle barrier portion 150M is formed on the middle inner spacer 170M and extends toward the lower surface 170M2 of the middle inner spacer 170M, but not extends to the lower surface 170M2 of the middle inner spacer 170M. The middle CESL portion 180M covers the middle barrier portion 150M. The middle ILD portion 190M covers the middle CESL portion 180M.

In an embodiment, the middle barrier portion 150M and the bottom barrier portion 150B may be formed of the same material in the same process, for example, plasma, etc. In an embodiment, the middle barrier portion 150M and the bottom barrier portion 150B may be formed of silicon-base dielectric material (such as SiCON, etc.), or metal-base dielectric material (such as HfO, $ZrO_2$, $TiO_2$, etc.).

Referring to FIGS. 2A to 2R_b, FIGS. 2A to 2R_b illustrate schematic diagrams of manufacturing processes of the semiconductor device 100 of FIGS. 1_a and 1_b.

As illustrated in FIG. 2A, the substrate 110, a plurality of the lower sheet layers 120L1', a plurality of the lower sheet layers 120L2', a plurality of the upper sheet layers 120U1', a plurality of the upper spacer layers 120U2' and the middle spacer layer 120M' are provided, wherein the substrate 110 is, for example, silicon wafer, the lower sheet layers 120L1', the lower sheet layers 120L2', the upper sheet layers 120U1', the upper spacer layers 120U2' and the middle spacer layer 120M' are formed on the substrate 110. The adjacent two lower sheet layers 120L1' are spaced by one lower spacer layer 120L2', and the adjacent two upper sheet layers 120U1' are spaced by one upper spacer layer 120U2'. A lower stack of the lower sheet layers 120L1' and the lower spacer layers 120L2' is spaced from an upper stack of the upper sheet layers 120U1' and the upper spacer layers 120U2' by the middle spacer layer 120M'. The lower sheet layer 120L1' and the upper sheet layer 120U1' may be formed of a material including, for example, silicon, and the lower spacer layer 120L2', the upper spacer layer 120U2' and the middle spacer layer 120M' may be formed of a material including, for example, silicon germanium (SiGe). In an embodiment, the lower spacer layer 120L1' and the middle spacer layer 120M' contains different proportions of silicon germanium. For example, the middle spacer layer 120M' contains a proportion of silicon germanium greater than that of the lower spacer layer 120L2'. In an embodiment, the middle spacer layer 120M' contains 45% of silicon germanium, and the lower spacer layer 120L2' contains 26% of silicon germanium. Similarly, the middle spacer layer 120M' contains a proportion of silicon germanium greater than that of the upper spacer layer 120U2'. For example, the middle spacer layer 120M' contains 45% of silicon germanium, and the upper spacer layer 120U2' contains 26% of silicon germanium. Different proportion of silicon germanium has a different etched rate.

Figure 2B:
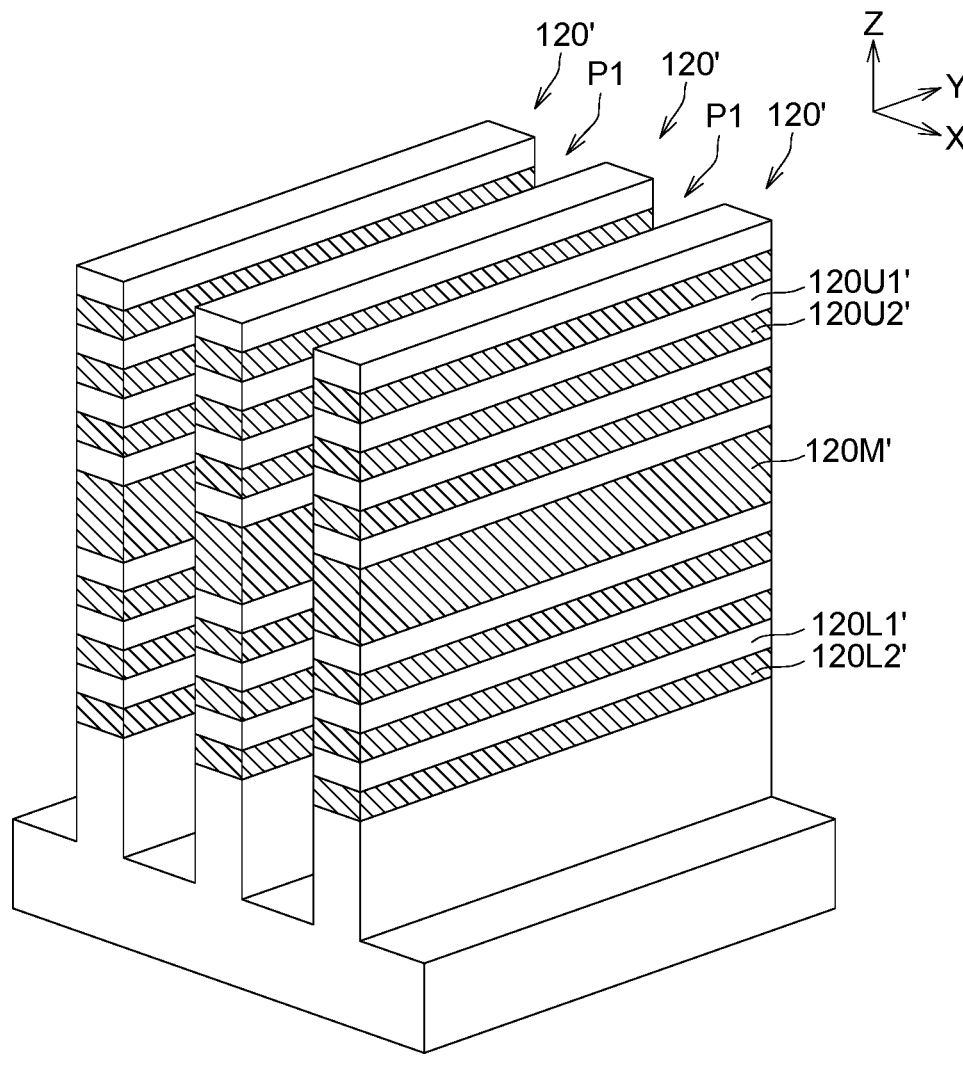

As illustrated in FIG. 2B, a portion of each lower sheet layer 120L1', a portion of each lower spacer layer 120L2', a portion of each sheet spacer layer 120U1', a portion of each upper spacer layer 120U2', a portion of the middle spacer layer 120M' and a portion of the substrate 110 are removed through a patterned hard mask (not illustrate) to form at least one space P1 by using, for example, etching, etc. A remaining portion of each lower sheet layer 120L1', a remaining portion of each lower spacer layer 120L2', a remaining portion of each sheet spacer layer 120U1', a remaining portion of each upper spacer layer 120U2', a remaining portion of the middle spacer layer 120M' form at least one fin structure 120' in the first direction (for example, Y axis). The region of one fin structure 120' defines one OD region, for example.

Figure 2C:
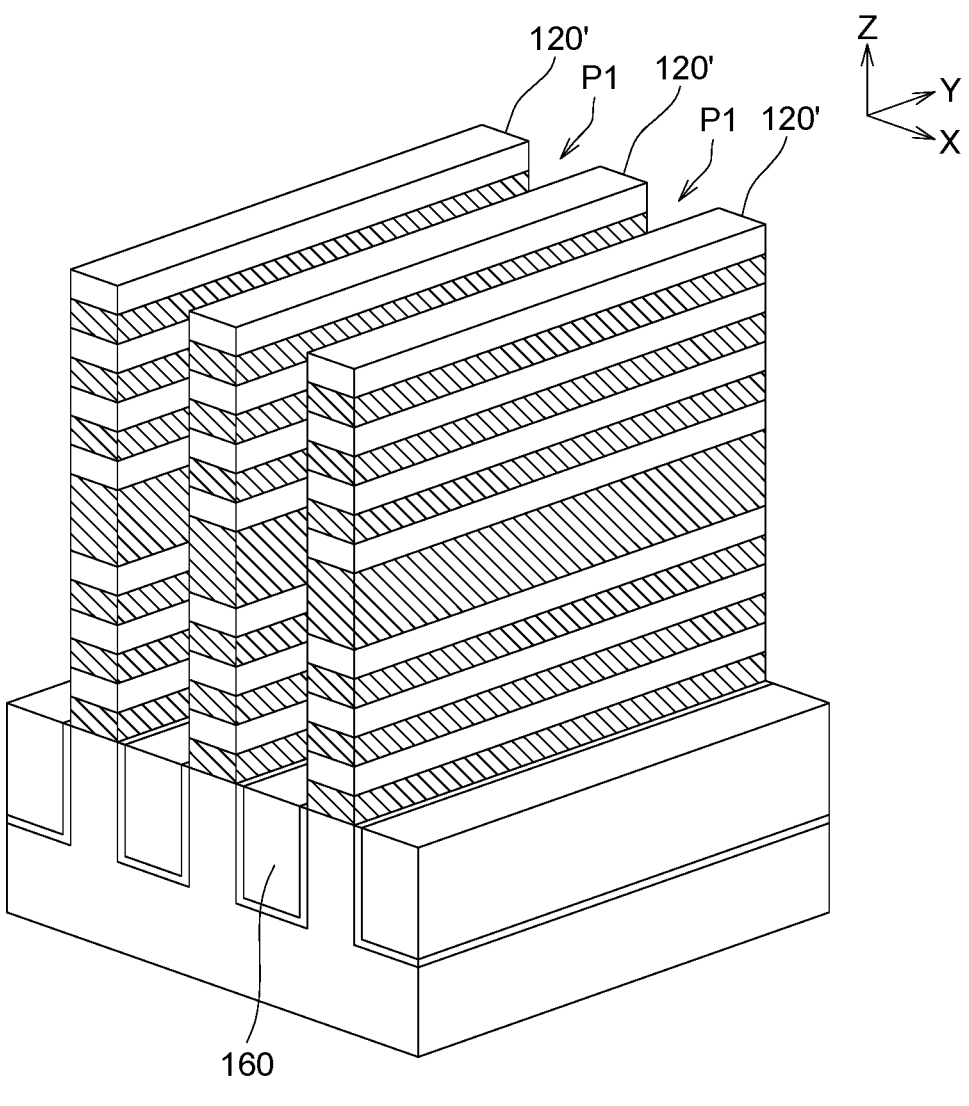

As illustrated in FIG. 2C, at least one oxide layer 160 is formed within a bottom portion of the space P1 by using, for example, deposition, Chemical-Mechanical Polishing (CMP), etching, etc.

Figure 2D:
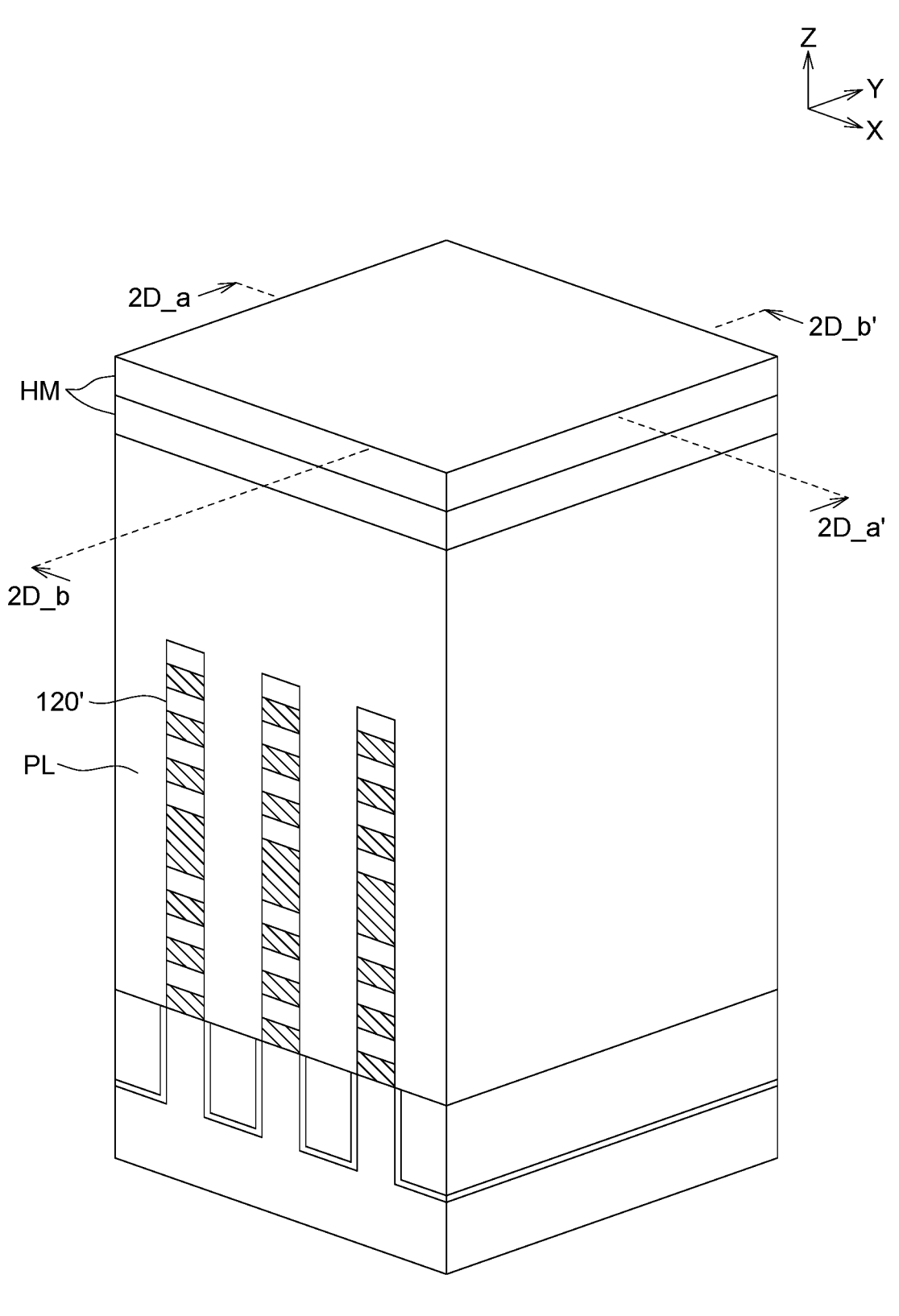
FIG. 2D_a illustrates a cross-sectional view of the semiconductor structure of FIG. 2D along a direction 2D_a-2D_a'.

As illustrated in FIGS. 2D, 2D_a and 2D_b, FIG. 2D_a illustrates a cross-sectional view of the semiconductor structure of FIG. 2D along a direction 2D_a-2D_a', and FIG. 2D_b illustrates a cross-sectional view of the semiconductor structure of FIG. 2D along a direction 2D_b-2D_b'.

In this step, a poly silicon material PL is formed within the spaces P1 and covers a top of each fin structure 120'. Then, a hard mask HM is formed on the poly silicon material PL.

Figure 2E:
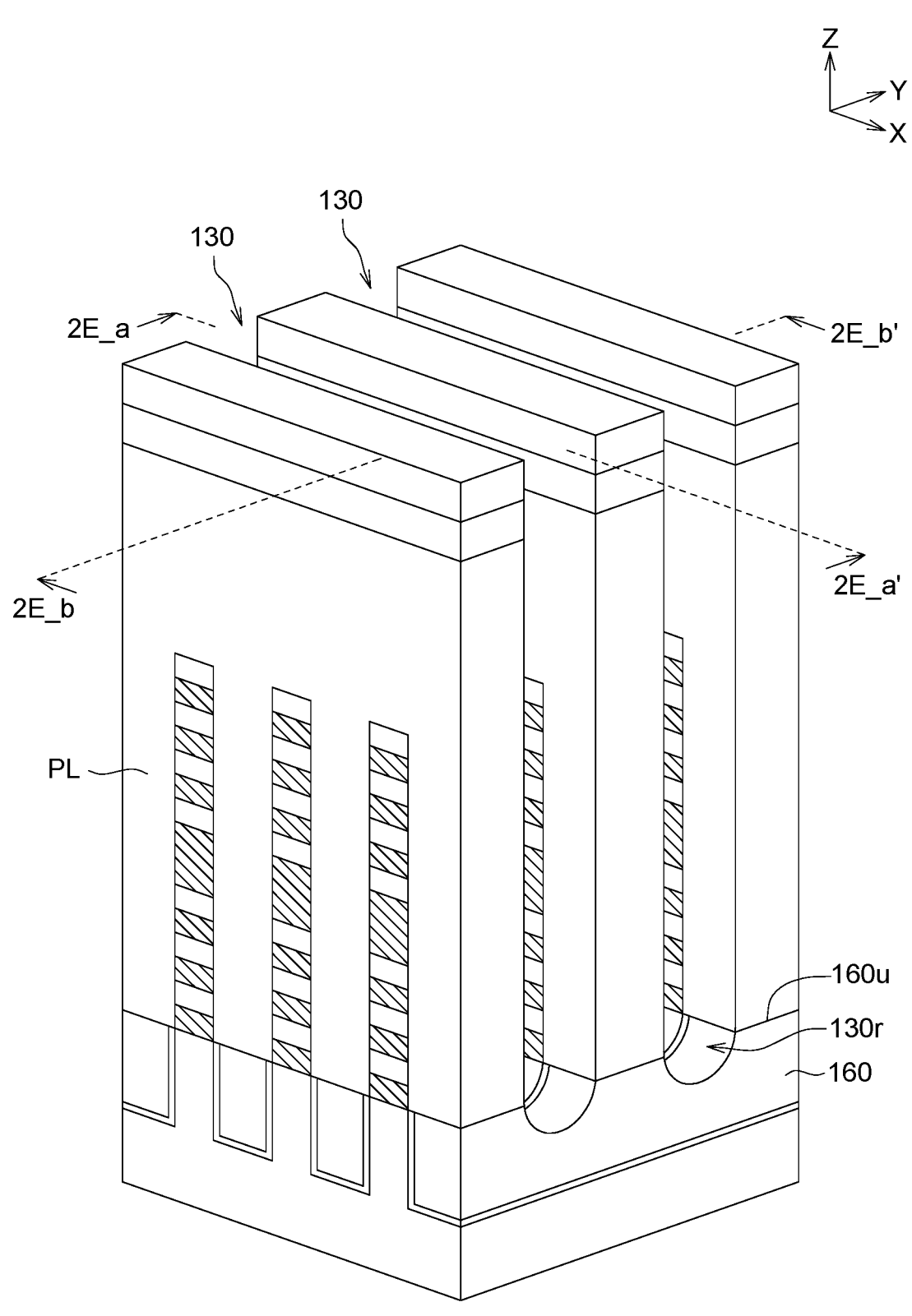
FIG. 2E_a illustrates a cross-sectional view of the semiconductor structure of FIG. 2E along a direction 2E_a-2E_a'.

As illustrated in FIGS. 2E, 2E_a and 2E_b, FIG. 2E_a illustrates a cross-sectional view of the semiconductor structure of FIG. 2E along a direction 2E_a-2E_a', and FIG. 2E_b illustrates a cross-sectional view of the semiconductor structure of FIG. 2E along a direction 2E_b-2E_b'.

In this step. at least one trench 130 passing through the lower sheet layers 120L1', the lower spacer layers 120L2', the upper sheet layers 120U1', the upper spacer layers 120U2' and the middle spacer layer 120M' of the fin structure 120' in the second direction (for example, X axis) through a patterned hard mask HM (the upper layer is, for example, photoresist layer, and the lower layer is, for example, nitride layer) by using, for example, etching, etc. The trench 130 has a bottom recess 130r recessed with respect to the upper surface 160u of the oxide layer 160. The trench 130 could divide one fin structure 120' into a plurality of active structures 120 arranged in the first direction (for example, Y axis).

As illustrated in FIGS. 2E, 2E_a and 2E_b, the active structure 120 includes the upper active region 120U, a middle spacer 120M and the lower active region 120L, wherein the middle spacer 120M separates the upper active region 120U from the lower active region 120L. The lower active region 120L includes a plurality of the lower sheets 120L1 and the lower spacers 120L2, wherein one of the lower spacers 120L2 is formed between adjacent two of the lower sheets 120L1. The upper active region 120U includes a plurality of the upper sheets 120U1 and the upper spacers 120U2, wherein one of the upper spacers 120U2 is formed between adjacent two of the upper sheets 120U1.

Figure 2F:
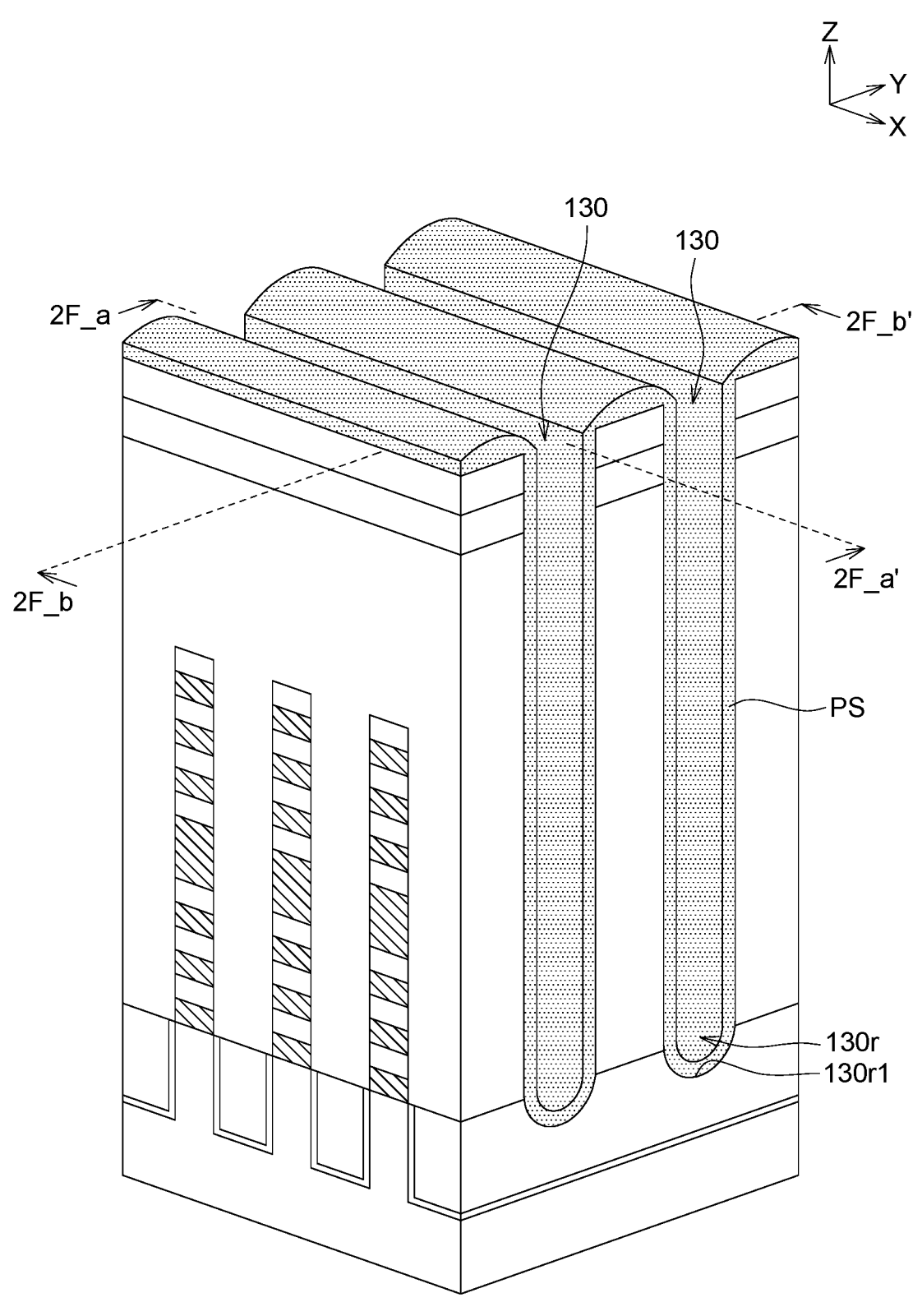
FIG. 2F_a illustrates a cross-sectional view of the semiconductor structure of FIG. 2F along a direction 2F_a-2F_a'.

As illustrated in FIGS. 2F, 2F_a and 2F_b, FIG. 2F_a illustrates a cross-sectional view of the semiconductor structure of FIG. 2F along a direction 2F_a-2F_a', and FIG. 2F_b illustrates a cross-sectional view of the semiconductor structure of FIG. 2F along a direction 2F_b-2F_b'.

In this step, a barrier layer material 150' is formed on a lateral surface 130s of the trench 130 and a sidewall 130r1 of the bottom recess 130r by, for example, deposition. The barrier layer material 150' is formed of a material including ploy silicon, etc., for example, silicon-base dielectric material (such as SiCON, etc.), or metal-base dielectric material (such as HfO, $ZrO_2$, $TiO_2$, etc.).

As illustrated in FIGS. 2G_a and 2G_b, FIG. 2G_a illustrates a schematic diagram of densifying the barrier layer material 150' of FIG. 2F_a, and FIG. 2G_b illustrates a schematic diagram of densifying the barrier layer material 150' of FIG. 2F_b.

In this step, a portion of the barrier layer material 150' is densified to form a barrier layer 150 (which may serve as a hard mask in in subsequent processes) by using, for example, plasma, etc., and the other of the barrier layer material 150' is remained to form a remained barrier portion 150". The barrier layer 150 has a density greater than that of the remained barrier portion 150". During plasma process, in the upper portion of the trench 130, the plasma is anisotropic (non-directional), and thus the plasma may be applied to the lateral surface 130s of the trench 130. With increasing depth, the anisotropic plasma will be transformed into directional plasma. As a result, in the lower portion of the trench 130, the plasma may not be applied to the lateral surface 130s of the trench 130, and thus the barrier portion 150" is remained, and the bottom barrier portion 150B is formed on the surface 130r1 of the bottom recess 130r by the directional plasma.

The barrier layer 150 includes an upper barrier portion 150U, the middle barrier portion 150M and the bottom barrier portion 150B. The upper barrier portion 150U is formed above the middle spacer 120M, the middle barrier portion 150M is formed on the middle inner spacer 170M, and the bottom barrier portion 150B is formed on or covers the surface 130r1 of the bottom recess 130r. The remained barrier portion 150" is located below the middle spacer 120M and located between the upper barrier portion 150U and the bottom barrier portion 150B. In the present embodiment, the middle barrier portion 150M extends from the upper barrier portion 150U toward a lower surface 120M2 of the middle spacer 120M, but not extends to a lower surface 170M2 of the middle spacer 120M. As a result, at least one portion of the lateral surface 120M1 may be covered by the remained barrier portion 150". After the remained barrier portion 150" is fully removed in subsequent processes, at least one portion of the lateral surface 120M1 of the middle spacer 120M could be exposed for being removed in subsequent processes. In another embodiment, a bottom surface of the middle barrier portion 150M may be substantially aligned with an upper surface 120M3 of the middle spacer 120M.

As illustrated in FIGS. 2H_a and 2H_b, FIG. 2H_a illustrates a schematic diagram of removing the remained barrier portion 150" of FIG. 2G_a, and FIG. 2H_b illustrates a schematic diagram of removing the remained barrier portion 150" of FIG. 2G_b.

In this step, the remained barrier portion 150" of FIGS. 2G_a and 2G_b is removed to expose the middle spacer 120M and the lower active region 120L including the lower sheets 120L1 and the lower spacers 120L2 by using, for example, etching, etc. Due to the barrier layer 150 having the greater density, after the remained barrier portion 150″ is fully removed, at least one portion of the barrier layer 150 may be still remained.

As illustrated in FIGS. 2I_a and 2I_b, FIG. 2I_a illustrates a schematic diagram of removing the middle spacer 120M of FIG. 2H_a, and FIG. 2I_b illustrates a schematic diagram of removing the middle spacer 120M of FIG. 2H_b.

In this step, the middle spacer 120M of FIGS. 2H_a and 2H_b is fully removed to form a hollow portion 120Ma, and a portion of the lower spacer 120L2 is removed to form a lower spacer recess 120L2r by using, for example, etching, etc. Due to the middle spacer 120M containing greater proportion of silicon germanium, after the middle spacer 120M is fully removed, another portion of the lower sheet 120L1 is still remained.

As illustrated in FIGS. 2J_a and 2J_b, FIG. 2J_a illustrates a schematic diagram of forming a middle inner spacer 170M within the hollow portion 120Ma and a lower inner spacer 170L within the lower spacer recess 120L2r of the lower spacer 120L2 of FIG. 2I_a, and FIG. 2J_b illustrates a schematic diagram of forming the middle inner spacer 170M within the hollow portion 120Ma and the lower inner spacer 170L within the lower spacer recess 120L2r of the lower spacer 120L2 of FIG. 2I_b.

In this step, the middle inner spacer 170M (or referred to as a Middle Dielectric isolation (MDI)) is formed within the hollow portion 120Ma, and the lower inner spacer 170L is formed within the lower spacer recess 120L2r of the lower spacer 120L2 of FIG. 2I_b by using, for example, deposition, etc.

As illustrated in FIGS. 2K_a and 2K_b, FIG. 2K_a illustrates a schematic diagram of forming at least one lower epitaxy 140L within the lower portion of the trench 130 of FIG. 2J_a, and FIG. 2K_b illustrates a schematic diagram of forming at least one lower epitaxy 140L within the lower portion of the trench 130 of FIG. 2J_a.

In this step, at least one lower epitaxy 140L is formed within the lower portion of the trench 130 which is not covered by the barrier layer 150 by using, for example, epitaxial growth process.

As illustrated in FIGS. 2L_a and 2L_b, FIG. 2L_a illustrates a schematic diagram of forming a contact etching stop layer (CESL) material 180′ on the lower epitaxy 140L, the upper barrier portion 150U and the oxide layer 160 of FIG. 2K_a, and FIG. 2L_b illustrates a schematic diagram of forming the CESL material 180′ on the lower epitaxy 140L, the upper barrier portion 150U and the oxide layer 160 of FIG. 2K_b.

In this step, the CESL material 180′ over the lower epitaxy 140L, the upper barrier portion 150U and the upper surface 160u of the oxide layer 160 is formed by using, for example, deposition, such as chemical vapor deposition (CVD), Plasma-Enhanced Chemical Vapor Deposition (PECVD), ALD (atomic layer deposition), or the like. The CESL material 180′ may be formed of a material including, for example, a dielectric material, such as silicon nitride, silicon oxide, silicon oxynitride, or the like.

Then, as illustrated in FIGS. 2L_a and 2L_b, an interlayer dielectric (ILD) material 190′ covering the CESL material 180′ is formed by using, for example, deposition, such as CVD, PECVD, or flowable chemical vapor deposition (FCVD), or the like. In addition, the ILD material 190′ may be planarized by, for example, CMP, etc. The ILD material 190′ may be formed of a dielectric including, for example, phospho-silicate glass (PSG), boro-silicate glass (BSG), boron-doped phospho-silicate glass (BPSG), undoped silicate glass (USG), or the like. Other insulation materials formed by any acceptable process may be used.

As illustrated in FIGS. 2M_a and 2M_b, FIG. 2M_a illustrates a schematic diagram of removing a portion of the ILD material 190′ of FIG. 2L_a, and FIG. 2M_b illustrates a schematic diagram of removing a portion of the ILD material 190′ of FIG. 2L_b.

In this step, a portion of the ILD material 190′ is removed by using, for example, etching, etc., and the other portion of the ILD material 190′ is remained to form a lower ILD portion 190L and a middle ILD portion 190M. In addition, a portion of the CESL material 180′ is by using, for example, etching, etc., and the other portion of the CESL material 180′ is remained to form a lower CESL portion 180L and a middle CESL portion 180M. In addition, the upper barrier portion 150U is removed to expose the upper active region 120U including the upper sheets 120U1 and the upper spacers 120U2 by using, for example, etching, etc. The removing for the upper barrier portion 150U, the CESL material 180′ and the ILD material 190′ may be performed in the same process, or different processes.

Then, at least one upper spacer recess 120U2r is formed on the exposed upper spacers 120U2 by using, for example, etching, etc.

As illustrated in FIGS. 2N_a and 2N_b, FIG. 2N_a illustrates a schematic diagram of forming at least one upper inner spacer 170U within the corresponding upper spacer recess 120U2r of the upper spacers 120U2 of FIG. 2M_a, and FIG. 2N_b illustrates a schematic diagram of forming at least one upper inner spacer 170U within the corresponding upper spacer recess 120U2r of the upper spacer layers 120U2 of FIG. 2M_b.

In this step, the upper inner spacer 170U is formed within the upper spacer recess 120U2r by using, for example, deposition, etc.

As illustrated in FIGS. 2O_a and 2O_b, FIG. 2O_a illustrates a schematic diagram of forming at least one upper epitaxy 140U within the upper portion of the trench 130 of FIG. 2N_a, and FIG. 2O_b illustrates a schematic diagram of forming at least one upper epitaxy 140U within the upper portion of the trench 130 of FIG. 2N_a.

In this step, the upper epitaxy 140U is formed within the upper portion of the trench 130 and formed on the exposed upper sheets 120U1 by using, for example, epitaxial growth process.

As illustrated in FIGS. 2P_a and 2P_b, FIG. 2P_a illustrates a schematic diagram of forming an upper CESL portion 180U on the upper epitaxy 140U, the middle ILD portion 190M and the poly silicon material PL of FIG. 2O_a, and FIG. 2P_b illustrates a schematic diagram of forming the upper CESL portion 180U on the upper epitaxy 140U, the middle ILD portion 190M and the poly silicon material PL of FIG. 2O_b.

In this step, the upper CESL portion 180U over the upper epitaxy 140U, the middle ILD portion 190M and a lateral surface of the poly silicon material PL is formed by using, for example, deposition, such as CVD, PECVD, ALD, or the like. The upper CESL portion 180U may be formed of a material including, for example, a dielectric material, such as silicon nitride, silicon oxide, silicon oxynitride, or the like.

Then, an upper ILD portion 190U covering the upper CESL portion 180U is formed by using, for example, deposition, such as CVD, PECVD, or FCVD, or the like. In addition, the upper ILD portion 190U may be planarized by, for example, CMP, etc. The upper ILD portion 190U may be formed of a dielectric including, for example, PSG, BSG, BPSG, USG, or the like. Other insulation materials formed by any acceptable process may be used.

As illustrated in FIGS. 2Q_a and 2Q_b, FIG. 2Q_a illustrates a schematic diagram of removing the poly silicon material PL of FIG. 2P_a, and FIG. 2Q_b illustrates a schematic diagram of removing the poly silicon material PL of FIG. 2P_b.

In this step, the poly silicon material PL is removed by using, for example, etching, etc.

As illustrated in FIGS. 2R_a and 2R_b, FIG. 2R_a illustrates a schematic diagram of removing the upper spacer 120U2 of FIG. 2Q_a, and FIG. 2R_b illustrates a schematic diagram of removing the upper spacer 120U2 of FIG. 2R_b.

In this step, the upper spacers 120U2 are removed to expose the upper sheets 120U1 by using, for example, etching, etc.

Then, at least one interface layer (IL) (not illustrated) over the upper sheets 120U1 is formed, then at least one High-k (HK) gate dielectric layer (not illustrated) over the interface layer is formed, and then at least one metal gate MG (as illustrated in FIG. 1_b) is formed around the sheets.

The High-k gate dielectric layer may be formed of a material including: (i) a high-k dielectric material, such as hafnium oxide ($HfO_2$), titanium oxide ($TiO_2$), hafnium zirconium oxide (HfZrO), tantalum oxide (Ta2O3), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, or (iv) a combination thereof. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a semiconductor device includes a bottom barrier portion formed on a bottom recess of a trench and separating a substrate and a lower epitaxy. Accordingly, the bottom barrier portion could avoid or reduce the leakage current to the substrate from an active region.

Example embodiment 1: a semiconductor device includes a substrate, a plurality of active structures, a trench, a lower epitaxy, an upper epitaxy and a bottom barrier portion. The active structures are formed on the substrate and arranged in a first direction. The trench passes through adjacent two of the active structures in a second direction and has a bottom recess. The lower epitaxy is formed on a lower portion of the trench. The upper epitaxy is formed on an upper portion of the trench and separated from the lower epitaxy. The bottom barrier portion is formed on the bottom recess and separates the substrate and the lower epitaxy.

Example embodiment 2 based on Example embodiment 1: the semiconductor device further includes an oxide layer formed on the substrate and having an upper surface; wherein the active structures protrude with respect to the upper surface of the oxide layer, and the bottom recess is recessed with respect to the upper surface of the oxide layer.

Example embodiment 3 based on Example embodiment 1: the semiconductor device further includes a middle barrier portion formed within the trench and isolating the lower epitaxy and the upper epitaxy.

Example embodiment 4 based on Example embodiment 3: the semiconductor device further includes a middle inner spacer formed in the active structure and having a lower surface; wherein the middle barrier portion extends toward the lower surface of the middle inner spacer, but not to the lower surface of the middle inner spacer.

Example embodiment 5 based on Example embodiment 1: the active structure includes an upper active region and a lower active region; the semiconductor device further includes a middle inner spacer separating the upper active region from the lower active region.

Example embodiment 6 based on Example embodiment 3: the bottom barrier portion and the middle barrier portion are formed of the same material.

Example embodiment 7 based on Example embodiment 1: the semiconductor device further includes a middle isolation located between the upper epitaxy and the lower epitaxy.

Example embodiment 8: a semiconductor device further includes a substrate, a plurality of active structures, a trench, an upper epitaxy, a lower epitaxy, a bottom barrier portion and a middle isolation. The active structures are formed on the substrate. The trench passes through adjacent two of the active structures and has a bottom recess. The upper epitaxy is formed on an upper portion of the trench. The lower epitaxy is formed on a lower portion of the trench. The bottom barrier portion is formed on the bottom recess. The middle isolation isolates the upper epitaxy from the lower epitaxy. The middle isolation is formed of a material the same as that of the bottom barrier.

Example embodiment 9 based on Example embodiment 8: the semiconductor device further includes a middle inner spacer and a middle barrier portion. The middle inner spacer is formed in the active structure and has a lower surface. The middle barrier portion extends toward the lower surface of the middle inner spacer, but not to the lower surface of the middle inner spacer.

Example embodiment 10 based on Example embodiment 8: the active structure includes an upper active region and a lower active region; the semiconductor device includes a middle inner spacer separating the upper active region from the lower active region.

Example embodiment 11 based on Example embodiment 9: the bottom barrier portion and the middle barrier portion are formed of the same material.

Example embodiment 12: a manufacturing method for a semiconductor device includes: forming a fin structure on the substrate, wherein the fin structure extends in a first direction; forming a trench passing through the fin structure to form a plurality of active structures, wherein the trench extends, in a second direction and has a bottom recess;

11 forming a bottom barrier portion formed on the bottom recess of the trench; forming a lower epitaxy on a lower portion of the trench; and forming an upper epitaxy on an upper portion of the trench, wherein the upper epitaxy is separated from the lower epitaxy.

Example embodiment 13 based on Example embodiment 12: the manufacturing method further includes: forming a barrier layer material on a lateral surface of the trench and a sidewall of the bottom recess; and densifying a portion of the barrier layer material to form a barrier layer; wherein the barrier layer has a density greater than that of the barrier layer material.

Example embodiment 14 based on Example embodiment 13: each active structure includes an upper active region, a lower active region and a middle spacer separating the upper active region from the lower active region; the barrier layer includes: the bottom barrier portion located below the middle spacer, and an upper barrier portion located above the middle spacer.

Example embodiment 15 based on Example embodiment 14: the other of the barrier layer material is remained to form a remained barrier portion, and the remained barrier portion is located between the bottom barrier portion and the upper barrier portion.

Example embodiment 16 based on Example embodiment 15: the manufacturing method further includes: removing the remained barrier portion to expose the lower active region; and forming the lower epitaxy on the lower portion of the trench corresponding to the lower active region.

Example embodiment 17 based on Example embodiment 12: each active structure includes an upper active region, a lower active region and a middle spacer separating the upper active region from the lower active region; the manufacturing method further includes: removing the middle spacer to form a hollow portion; and forming a middle inner spacer within the hollow portion.

Example embodiment 18 based on Example embodiment 14: the barrier layer further includes a middle barrier portion formed on a lateral surface of the middle spacer; wherein the middle barrier portion extends from the upper barrier portion toward a lower surface of the middle spacer, but not extends to the lower surface of the middle spacer.

Example embodiment 19 based on Example embodiment 14: the manufacturing method further includes: removing the upper barrier portion to expose the upper active region; and forming the upper epitaxy on the upper portion of the trench corresponding to the upper active region.

Example embodiment 20 based on Example embodiment 14: the barrier layer further includes a middle barrier portion formed on a lateral surface of the middle spacer; wherein the middle barrier portion has a bottom surface aligned with au upper surface of the middle spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:

1. A manufacturing method for a semiconductor device, comprising:
forming a fin structure on a substrate, wherein the fin structure extends in a first direction;
forming a trench passing through the fin structure to form a plurality of active structures, wherein the trench extends, in a second direction and has a bottom recess;
forming a bottom barrier portion formed on the bottom recess of the trench;
forming a lower epitaxy on a lower portion of the trench;
forming a CESL (contact etching stop layer) portion and a ILD (interlayer dielectric) portion within the trench; and
forming an upper epitaxy on an upper portion of the trench, wherein the upper epitaxy is separated from the lower epitaxy;
wherein in forming the CESL portion and the ILD portion within the trench, the manufacturing method further comprises:
forming a CESL material in the trench;
forming a ILD material on the CESL material, wherein the CESL material covers a bottom surface of the ILD material and a lateral surface of the ILD material;
in the same process, removing a portion of the CESL material and a portion of the ILD material, wherein a remaining portion of the CESL material forms the CESL portion and a remaining portion of the ILD material forms the ILD portion.

2. The manufacturing method as claimed in claim 1, further comprising:
forming a barrier layer material on a lateral surface of the trench and a sidewall of the bottom recess; and
densifying a portion of the barrier layer material to form a barrier layer;
wherein the barrier layer has a density greater than that of the barrier layer material.

3. The manufacturing method as claimed in claim 2, wherein each active structure comprises an upper active region, a lower active region and a middle spacer separating the upper active region from the lower active region; the barrier layer comprises:
the bottom barrier portion located below the middle spacer; and
an upper barrier portion located above the middle spacer.

4. The manufacturing method as claimed in claim 3, wherein another portion of the barrier layer material is remained to form a remained barrier portion, and the remained barrier portion is located between the bottom barrier portion and the upper barrier portion.

5. The manufacturing method as claimed in claim 4, further comprising:
removing the remained barrier portion to expose the lower active region; and
forming the lower epitaxy on the lower portion of the trench corresponding to the lower active region.

6. The manufacturing method as claimed in claim 1, wherein each active structure comprises an upper active region, a lower active region and a middle spacer separating the upper active region from the lower active region; the manufacturing method further comprises:
removing the middle spacer to form a hollow portion; and
forming a middle inner spacer within the hollow portion.

7. The manufacturing method as claimed in claim 3, wherein the barrier layer comprises:

a middle barrier portion formed on a lateral surface of the middle spacer;

wherein the middle barrier portion extends from the upper barrier portion toward a lower surface of the middle spacer, but not extends to the lower surface of the middle spacer.

8. The manufacturing method as claimed in claim 3, further comprising:

removing the upper barrier portion to expose the upper active region; and forming the upper epitaxy on the upper portion of the trench corresponding to the upper active region.

9. The manufacturing method as claimed in claim 3 wherein the barrier layer comprises:

a middle barrier portion formed on a lateral surface of the middle spacer;

wherein the middle barrier portion has a bottom surface aligned with au upper surface of the middle spacer.

10. A manufacturing method for a semiconductor device, comprising:

forming a fin structure on a substrate, wherein the fin structure extends in a first direction;

forming a trench passing through the fin structure to form a plurality of active structures, wherein the trench extends, in a second direction;

forming a lower epitaxy on a lower portion of the trench;

forming a CESL portion and a ILD portion within the trench; and forming an upper epitaxy on an upper portion of the trench, wherein the upper epitaxy is separated from the lower epitaxy by the CESL portion and the ILD portion;

wherein in forming the CESL portion and the ILD portion within the trench, the manufacturing method further comprises:

forming a CESL material in the trench;

forming a ILD material on the CESL material, wherein the CESL material covers a bottom surface of the ILD material and a lateral surface of the ILD material;

in the same process, removing a portion of the CESL material and a portion of the ILD material, wherein a remaining portion of the CESL material forms the CESL portion and a remaining portion of the ILD material forms the ILD portion.

11. The manufacturing method as claimed in claim 10, further comprises:

before forming the lower epitaxy on the lower portion of the trench, forming a middle barrier portion within the trench.

12. The manufacturing method as claimed in claim 11, wherein in forming the middle barrier portion within the trench, the middle barrier portion is formed on a lateral surface of the CESL portion.

13. The manufacturing method as claimed in claim 10, further comprising:

before forming the lower epitaxy on the lower portion of the trench, forming a bottom barrier portion in the trench.

14. The manufacturing method as claimed in claim 13, wherein in forming the trench passing through the fin structure to form the plurality of active structure, the trench has a bottom recess; the manufacturing method further comprises:

before forming the lower epitaxy on the lower portion of the trench, forming the bottom barrier portion in the bottom recess of the trench.

15. The manufacturing method as claimed in claim 13, wherein the bottom barrier portion and the middle barrier portion are formed of the same material.

16. A manufacturing method for a semiconductor device, comprising:

forming a fin structure on a substrate, wherein the fin structure extends in a first direction;

forming a trench passing through the fin structure to form a plurality of active structures, wherein the trench extends, in a second direction;

forming a lower epitaxy on a lower portion of the trench;

forming a CESL material in the trench;

forming a ILD material in the trench;

in the same process, removing a portion of the CESL material to form a CESL portion and removing a portion of the ILD material to form an ILD portion;

forming an upper epitaxy on an upper portion of the trench, wherein the upper epitaxy is separated from the lower epitaxy by the CESL portion and the ILD portion.

17. The manufacturing method as claimed in claim 16, further comprising:

before forming the CESL material in the trench, forming an upper barrier portion in the trench.

18. The manufacturing method as claimed in claim 16, further comprising:

forming a middle barrier portion; and forming a middle inner spacer in the active structure, wherein the middle inner spacer has a lower surface;

wherein the middle barrier portion extends toward the lower surface of the middle inner spacer, but not to the lower surface of the middle inner spacer.

19. The manufacturing method as claimed in claim 16, further comprising:

before forming the lower epitaxy on the lower portion of the trench, forming a bottom barrier portion in the trench.

20. The manufacturing method as claimed in claim 19, wherein the bottom barrier portion and a middle barrier portion are formed of the same material.

* * * * *